United States Patent
Chan et al.

(10) Patent No.: US 8,748,915 B2
(45) Date of Patent: Jun. 10, 2014

(54) EMITTER PACKAGE WITH ANGLED OR VERTICAL LED

(75) Inventors: Alex Chi Keung Chan, Sheung Shui (HK); David Todd Emerson, Chapel Hill, NC (US)

(73) Assignees: Cree Hong Kong Limited, Shatin, New Territories (HK); Cree, Inc., Durham, NC (US)

( * ) Notice: Subject to any disclaimer, the term of this patent is extended or adjusted under 35 U.S.C. 154(b) by 83 days.

(21) Appl. No.: 12/868,567

(22) Filed: Aug. 25, 2010

(65) Prior Publication Data

US 2011/0042698 A1 Feb. 24, 2011

Related U.S. Application Data

(63) Continuation-in-part of application No. 12/635,818, filed on Dec. 11, 2009, now Pat. No. 8,362,512, which is a continuation of application No. 11/739,307, filed on Apr. 24, 2007, now Pat. No. 7,649,209.

(60) Provisional application No. 60/745,478, filed on Apr. 24, 2006.

(51) Int. Cl.
*H01L 33/08* (2010.01)

(52) U.S. Cl.
USPC .. 257/91; 257/98; 257/E33.069; 257/E33.005

(58) Field of Classification Search
USPC .......... 257/91, 98, E33.067, E33.058
See application file for complete search history.

(56) References Cited

U.S. PATENT DOCUMENTS

| 3,760,237 A | 9/1973 | Jaffe ............................. 257/98 |
| 4,307,297 A | 12/1981 | Groff |

(Continued)

FOREIGN PATENT DOCUMENTS

| CN | 1274906 A | 11/2000 |
| CN | 2498694 | 7/2002 |

(Continued)

OTHER PUBLICATIONS

Office Action in related U.S. Appl. No. 12/002,410, dated: Apr. 26, 2011.

(Continued)

*Primary Examiner* — Zandra Smith
*Assistant Examiner* — Paul Patton
(74) *Attorney, Agent, or Firm* — Koppel, Patrick, Heybl & Philpott

(57) ABSTRACT

The present invention is directed to LED packages and LED displays utilizing the LED packages, wherein the LED chips within the packages are arranged in unique orientations to provide the desired package or display FFP. One LED package according to the present invention comprises a reflective cup and an LED chip mounted in the reflective cup. The reflective cup has a first axis and a second axis orthogonal to the first axis, wherein the LED chip is rotated within the reflective cup so that the LED chip is out of alignment with said first axis. Some of the LED packages can comprise a rectangular LED chip having a chip longitudinal axis and an oval shaped reflective cup having a cup longitudinal axis. The LED chip is mounted within the reflective cup with the chip longitudinal axis angled from the cup longitudinal axis. LED displays according to the present invention comprise a plurality of LED packages, at least some of which have an LED chip mounted in a reflective cup at different angles to achieve the desired display FFP.

40 Claims, 8 Drawing Sheets

(56) References Cited

U.S. PATENT DOCUMENTS

| | | | |
|---|---|---|---|
| 4,322,735 A | 3/1982 | Sadamasa et al. | |
| 4,511,425 A | 4/1985 | Boyd | 156/493 |
| 4,946,547 A | 8/1990 | Palmour et al. | 156/643 |
| 5,040,868 A | 8/1991 | Waitl | |
| 5,042,048 A | 8/1991 | Meyer | 372/108 |
| 5,122,943 A | 6/1992 | Pugh | 362/256 |
| 5,130,761 A | 7/1992 | Tanaka | 357/17 |
| 5,167,556 A | 12/1992 | Stein | |
| 5,200,022 A | 4/1993 | Kong et al. | 156/612 |
| 5,351,106 A | 9/1994 | Lesko et al. | 355/83 |
| RE34,861 E | 2/1995 | Davis et al. | 437/100 |
| 5,703,401 A | 12/1997 | Van De Water | |
| 5,706,177 A | 1/1998 | Nather | |
| 5,790,298 A | 8/1998 | Tonar | 359/267 |
| 5,813,753 A | 9/1998 | Vriens et al. | 362/293 |
| 5,907,151 A | 5/1999 | Gramann | |
| 5,942,770 A | 8/1999 | Ishinaga et al. | 257/89 |
| 5,959,316 A | 9/1999 | Lowery | 257/98 |
| 6,061,160 A | 5/2000 | Maruyama | 359/152 |
| 6,066,861 A | 5/2000 | Hohn et al. | |
| 6,183,100 B1 | 2/2001 | Suckow et al. | 362/35 |
| 6,224,216 B1 | 5/2001 | Parker et al. | 353/31 |
| 6,259,608 B1 | 7/2001 | Berardinelli et al. | |
| 6,274,924 B1 | 8/2001 | Carey et al. | 257/676 |
| 6,296,367 B1 | 10/2001 | Parsons et al. | 362/183 |
| 6,359,236 B1 | 3/2002 | DiStefano et al. | |
| 6,376,902 B1 | 4/2002 | Arndt | 257/678 |
| 6,447,124 B1 | 9/2002 | Fletcher et al. | 359/604 |
| 6,454,437 B1 | 9/2002 | Kelly | 362/246 |
| 6,469,321 B2 | 10/2002 | Arndt | |
| 6,480,389 B1 | 11/2002 | Shie et al. | 361/707 |
| 6,517,218 B2 | 2/2003 | Hochstein | 362/294 |
| 6,536,913 B1 | 3/2003 | Yajima et al. | 362/231 |
| 6,573,580 B2 | 6/2003 | Arndt | |
| 6,610,563 B1 | 8/2003 | Waitl | |
| 6,614,058 B2 | 9/2003 | Lin et al. | |
| 6,621,210 B2 | 9/2003 | Kato et al. | 313/496 |
| 6,624,491 B2 | 9/2003 | Waitl et al. | |
| 6,680,490 B2 | 1/2004 | Yasukawa et al. | |
| 6,686,609 B1 | 2/2004 | Sung | |
| 6,700,136 B2 | 3/2004 | Guida | 257/79 |
| 6,707,069 B2 | 3/2004 | Song et al. | 257/79 |
| 6,710,373 B2 | 3/2004 | Wang | |
| 6,717,353 B1 | 4/2004 | Mueller et al. | 313/501 |
| 6,759,733 B2 | 7/2004 | Arndt | 257/672 |
| 6,765,235 B2 | 7/2004 | Taninaka et al. | 257/88 |
| 6,770,498 B2 | 8/2004 | Hsu | 438/26 |
| 6,774,401 B2 | 8/2004 | Nakada et al. | |
| 6,791,259 B1 | 9/2004 | Stokes | |
| 6,858,879 B2 | 2/2005 | Waitl | |
| 6,872,585 B2 | 3/2005 | Matsumura et al. | |
| 6,876,149 B2 | 4/2005 | Miyashita | |
| 6,900,511 B2 | 5/2005 | Ruhnau et al. | |
| 6,911,678 B2 | 6/2005 | Fujisawa et al. | |
| 6,914,268 B2 | 7/2005 | Shei | 257/99 |
| 6,919,586 B2 | 7/2005 | Fujii | |
| 6,940,704 B2 | 9/2005 | Stalions | |
| 6,946,714 B2 | 9/2005 | Waitl | |
| 6,964,877 B2 | 11/2005 | Chen et al. | 438/20 |
| 6,975,011 B2 | 12/2005 | Arndt | |
| 6,995,510 B2 | 2/2006 | Murakami et al. | |
| D517,025 S | 3/2006 | Asakawa | D13/180 |
| 7,009,627 B2 | 3/2006 | Abe et al. | 345/690 |
| 7,021,797 B2 | 4/2006 | Minano et al. | 362/355 |
| 7,064,907 B2 | 6/2006 | Kaneko | |
| 7,066,626 B2 | 6/2006 | Omata | 362/257 |
| 7,102,213 B2 | 9/2006 | Sorg | |
| 7,119,422 B2 | 10/2006 | Chin | 257/666 |
| 7,161,189 B2 | 1/2007 | Wu | 257/98 |
| 7,187,009 B2 | 3/2007 | Fukasawa et al. | 257/98 |
| 7,213,940 B1 | 5/2007 | Van De Ven et al. | 362/231 |
| 7,224,000 B2 | 5/2007 | Aanegola et al. | 257/98 |
| 7,244,965 B2 | 7/2007 | Andrews et al. | 257/98 |
| 7,282,740 B2 | 10/2007 | Chikugawa et al. | 257/79 |
| 7,285,802 B2 | 10/2007 | Ouderkirk et al. | 257/98 |
| 7,303,315 B2 | 12/2007 | Ouderkirk et al. | 362/294 |
| D572,210 S | 7/2008 | Lee | D13/180 |
| D572,670 S | 7/2008 | Ono et al. | D13/180 |
| D576,574 S | 9/2008 | Kobayakawa | D13/180 |
| 7,429,757 B2 | 9/2008 | Oyama et al. | 257/675 |
| D591,697 S | 5/2009 | Andrews et al. | D13/182 |
| D593,224 S | 5/2009 | Hanley | D26/2 |
| D598,579 S | 8/2009 | Hanley | D26/1 |
| 7,579,628 B2 | 8/2009 | Inoguchi | 257/81 |
| 7,622,795 B2 | 11/2009 | Chiang | 257/675 |
| 7,635,915 B2 | 12/2009 | Xie et al. | 257/692 |
| 7,692,206 B2 | 4/2010 | Loh | 257/99 |
| 7,777,412 B2 | 8/2010 | Pang | 313/506 |
| 7,800,124 B2 * | 9/2010 | Urano et al. | 257/98 |
| 7,875,899 B2 | 1/2011 | Yasuda | 257/99 |
| 8,217,414 B2 | 7/2012 | Hayashi | 257/99 |
| 2002/0021085 A1 | 2/2002 | Ng | |
| 2002/0030194 A1 | 3/2002 | Camras et al. | |
| 2002/0061174 A1 | 5/2002 | Hurt et al. | |
| 2002/0066905 A1 | 6/2002 | Wang | |
| 2002/0123163 A1 | 9/2002 | Fujii | |
| 2002/0163001 A1 | 11/2002 | Shaddock | |
| 2002/0171911 A1 | 11/2002 | Maegawa | |
| 2002/0195935 A1 | 12/2002 | Jager | |
| 2003/0116769 A1 | 6/2003 | Song et al. | |
| 2003/0160256 A1 | 8/2003 | Durocher et al. | 257/88 |
| 2003/0183852 A1 | 10/2003 | Takenaka | |
| 2004/0016938 A1 | 1/2004 | Baretz et al. | 257/100 |
| 2004/0037076 A1 | 2/2004 | Katoh et al. | 362/235 |
| 2004/0041222 A1 | 3/2004 | Loh | |
| 2004/0047151 A1 | 3/2004 | Bogner et al. | |
| 2004/0079957 A1 | 4/2004 | Andrews et al. | |
| 2004/0080939 A1 | 4/2004 | Braddell et al. | |
| 2004/0126913 A1 | 7/2004 | Loh | |
| 2004/0217364 A1 | 11/2004 | Tarsa | |
| 2004/0227149 A1 | 11/2004 | Ibbetson | |
| 2004/0232435 A1 | 11/2004 | Hofer | |
| 2004/0238930 A1 | 12/2004 | Arndt | |
| 2004/0256706 A1 | 12/2004 | Nakashima | |
| 2005/0023548 A1 | 2/2005 | Bhat | |
| 2005/0072981 A1 | 4/2005 | Suenaga | |
| 2005/0077535 A1 | 4/2005 | Li | |
| 2005/0093005 A1 | 5/2005 | Ruhnau | |
| 2005/0110033 A1 | 5/2005 | Heremans et al. | 257/98 |
| 2005/0117320 A1 | 6/2005 | Leu et al. | |
| 2005/0127377 A1 | 6/2005 | Arndt | |
| 2005/0135105 A1 | 6/2005 | Teixeira et al. | |
| 2005/0152127 A1 | 7/2005 | Kamiya et al. | |
| 2005/0156187 A1 | 7/2005 | Isokawa et al. | |
| 2005/0179041 A1 | 8/2005 | Harbers et al. | |
| 2005/0179376 A1 | 8/2005 | Fung et al. | |
| 2005/0199899 A1 | 9/2005 | Lin et al. | 257/99 |
| 2005/0231983 A1 | 10/2005 | Dahm | |
| 2005/0253130 A1 | 11/2005 | Tsutsumi et al. | 257/13 |
| 2006/0022212 A1 | 2/2006 | Waitl | |
| 2006/0049477 A1 | 3/2006 | Arndt | |
| 2006/0060867 A1 | 3/2006 | Suehiro | 257/81 |
| 2006/0091406 A1 | 5/2006 | Kaneko et al. | 257/81 |
| 2006/0102917 A1 | 5/2006 | Oyama et al. | |
| 2006/0108594 A1 | 5/2006 | Iwasaki et al. | |
| 2006/0131591 A1 | 6/2006 | Sumitani | |
| 2006/0133044 A1 | 6/2006 | Kim et al. | |
| 2006/0151809 A1 | 7/2006 | Isokawa | |
| 2006/0157828 A1 | 7/2006 | Sorg | |
| 2006/0220046 A1 | 10/2006 | Yu et al. | |
| 2006/0267042 A1 | 11/2006 | Izuno et al. | 257/100 |
| 2006/0278882 A1* | 12/2006 | Leung et al. | 257/98 |
| 2006/0291185 A1 | 12/2006 | Atsushi | 362/29 |
| 2007/0046176 A1 | 3/2007 | Bukesov et al. | |
| 2007/0096139 A1 | 5/2007 | Schultz | |
| 2007/0109779 A1 | 5/2007 | Sekiguchi | |
| 2007/0145401 A1 | 6/2007 | Ikehara | |
| 2007/0170449 A1 | 7/2007 | Anandian | |
| 2007/0241357 A1 | 10/2007 | Yan | 257/98 |
| 2007/0262328 A1 | 11/2007 | Bando | |
| 2007/0262339 A1 | 11/2007 | Hussell et al. | |
| 2007/0269586 A1 | 11/2007 | Leatherdale | |
| 2007/0295975 A1 | 12/2007 | Omae | 257/89 |
| 2008/0013319 A1 | 1/2008 | Pei et al. | |

(56) References Cited

U.S. PATENT DOCUMENTS

| | | | |
|---|---|---|---|
| 2008/0026498 A1 | 1/2008 | Tarsa et al. ............... 438/26 |
| 2008/0074032 A1 | 3/2008 | Yano et al. ............... 313/503 |
| 2008/0093606 A1 | 4/2008 | Pan et al. |
| 2008/0121921 A1 | 5/2008 | Loh et al. |
| 2008/0149960 A1 | 6/2008 | Amo et al. ............... 257/98 |
| 2008/0170391 A1 | 7/2008 | Norfidathul et al. ........ 362/227 |
| 2008/0186702 A1 | 8/2008 | Camras et al. |
| 2008/0191232 A1 | 8/2008 | Lee et al. |
| 2008/0198594 A1 | 8/2008 | Lee |
| 2008/0230790 A1 | 9/2008 | Seko et al. |
| 2008/0258156 A1* | 10/2008 | Hata .......................... 257/88 |
| 2008/0296590 A1 | 12/2008 | Ng ............................. 257/88 |
| 2008/0303052 A1 | 12/2008 | Lee et al. |
| 2008/0308825 A1 | 12/2008 | Chakraborty |
| 2009/0050908 A1 | 2/2009 | Yuan et al. |
| 2009/0050911 A1 | 2/2009 | Chakraborty |
| 2009/0057699 A1 | 3/2009 | Basin |
| 2009/0057708 A1 | 3/2009 | Abdul Karim et al. ........ 257/100 |
| 2009/0072251 A1* | 3/2009 | Chan et al. .................... 257/89 |
| 2009/0095966 A1 | 4/2009 | Keller et al. ................. 257/98 |
| 2009/0129085 A1 | 5/2009 | Aizar et al. ................. 362/247 |
| 2009/0189178 A1 | 7/2009 | Kim et al. |
| 2009/0283781 A1 | 11/2009 | Chan et al. |
| 2010/0044735 A1 | 2/2010 | Oyamada |
| 2010/0103660 A1 | 4/2010 | Van de Ven et al. ........ 362/231 |
| 2010/0193822 A1 | 8/2010 | Inobe et al. ................. 257/98 |
| 2011/0049545 A1 | 3/2011 | Basin et al. ................. 257/98 |
| 2011/0108874 A1 | 5/2011 | Chu et al. |
| 2011/0121345 A1 | 5/2011 | Andrews et al. |
| 2011/0186880 A1 | 8/2011 | Kohler et al. ................ 257/91 |
| 2011/0193118 A1 | 8/2011 | Oshima et al. |
| 2011/0278617 A1 | 11/2011 | Lee |
| 2012/0235199 A1 | 9/2012 | Andrews et al. |
| 2012/0257386 A1 | 10/2012 | Harbers et al. ............... 362/235 |

FOREIGN PATENT DOCUMENTS

| | | | |
|---|---|---|---|
| CN | 2617039 Y | 5/2004 |
| CN | 2646873 | 10/2004 |
| CN | 1581527 A | 2/2005 |
| CN | 1591924 A | 3/2005 |
| CN | 1679168 A | 10/2005 |
| CN | 1720608 A | 1/2006 |
| CN | 1744335 A | 3/2006 |
| CN | 1801498 A | 7/2006 |
| CN | 1874011 A | 12/2006 |
| CN | 1913135 A | 2/2007 |
| CN | 1977399 A | 6/2007 |
| CN | 101005109 A | 7/2007 |
| CN | 101013689 | 8/2007 |
| CN | 101061590 A | 10/2007 |
| CN | 101360368 | 2/2009 |
| DE | 202007012162 | 4/2008 |
| EP | 1005085 A2 | 5/2000 |
| EP | 1187226 A1 | 3/2002 |
| EP | 1187227 | 3/2002 |
| EP | 1187228 | 3/2002 |
| EP | 1 418 630 A1 | 5/2004 |
| EP | 1521313 | 4/2005 |
| EP | 1 538 680 A2 | 6/2005 |
| EP | 1653254 A2 | 5/2006 |
| EP | 1864780 | 12/2007 |
| EP | 1 953 834 A1 | 8/2008 |
| GB | 2420221 | 12/2004 |
| GB | 2420221 A | 5/2006 |
| GB | 2 458 972 A | 10/2009 |
| GB | 2466633 A | 7/2010 |
| JP | 53-118019 | 10/1978 |
| JP | S53118019 | 10/1978 |
| JP | S53126570 | 10/1978 |
| JP | 59-27559 A | 2/1984 |
| JP | 59027559 | 2/1984 |
| JP | 61-48951 A | 3/1986 |
| JP | 6148951 | 3/1986 |
| JP | 61048951 | 3/1986 |
| JP | S62160564 | 3/1986 |
| JP | 62047156 | 2/1987 |
| JP | 62140758 | 9/1987 |
| JP | 11054802 | * 2/1990 | ............. H01L 33/00 |
| JP | 038459 | 1/1991 |
| JP | 03-171780 | 7/1991 |
| JP | 06-177424 | 6/1994 |
| JP | 7-202271 A | 8/1995 |
| JP | 07202271 | 8/1995 |
| JP | 08032120 | 2/1996 |
| JP | 61048951 | 3/1996 |
| JP | 8139257 | 5/1996 |
| JP | 10321909 | 12/1998 |
| JP | 11008405 | 1/1999 |
| JP | 11-054802 | * 2/1999 | ............. H01L 33/00 |
| JP | 11150306 | 6/1999 |
| JP | 11167805 A | 6/1999 |
| JP | 11261113 | 9/1999 |
| JP | 2000-188358 | 7/2000 |
| JP | 2000-223751 | 8/2000 |
| JP | 2000223752 | 8/2000 |
| JP | 2000261041 | 9/2000 |
| JP | 2001044506 | 2/2001 |
| JP | 200160072 | 3/2001 |
| JP | 2001-168400 | 6/2001 |
| JP | 2001237463 | 8/2001 |
| JP | 2001518692 | 10/2001 |
| JP | 2002009217 | 1/2002 |
| JP | 2002-223005 | 8/2002 |
| JP | 2002374005 | 12/2002 |
| JP | 2003-197974 | 7/2003 |
| JP | 2003-264267 | 9/2003 |
| JP | 2003318449 | 11/2003 |
| JP | 2003324214 | 11/2003 |
| JP | 2004022862 | 1/2004 |
| JP | 2004056075 | 2/2004 |
| JP | 2004103775 | 2/2004 |
| JP | 2004507114 | 3/2004 |
| JP | 2004-111937 A | 4/2004 |
| JP | 2004146815 | 5/2004 |
| JP | 2004-200236 | 7/2004 |
| JP | 2004228387 | 8/2004 |
| JP | 2004335740 | 11/2004 |
| JP | 2004335880 | 11/2004 |
| JP | 2005-19838 A | 1/2005 |
| JP | 2005019838 | 1/2005 |
| JP | 2005-079167 | 3/2005 |
| JP | 2005150624 | 6/2005 |
| JP | 2005-310935 | 11/2005 |
| JP | 2005347401 | 12/2005 |
| JP | 2005539386 | 12/2005 |
| JP | 2006019557 | 1/2006 |
| JP | 2006508537 | 3/2006 |
| JP | 2006509372 A | 3/2006 |
| JP | 2006108517 | 4/2006 |
| JP | 2006-119357 | 5/2006 |
| JP | 2006-324331 | 11/2006 |
| JP | 2006344692 | 12/2006 |
| JP | 2007-094088 | 4/2007 |
| JP | 2007509505 | 4/2007 |
| JP | 2007-165029 | 6/2007 |
| JP | 2007165840 | 6/2007 |
| JP | 2007184542 | 7/2007 |
| JP | 2007243226 | 9/2007 |
| JP | 2007-273763 | 10/2007 |
| JP | 2007-287981 | 11/2007 |
| JP | 2007-299905 | 11/2007 |
| JP | 2007317896 | 12/2007 |
| JP | 2007329516 | 12/2007 |
| JP | 2008521236 | 6/2008 |
| WO | WO9931737 | 6/1999 |
| WO | WO0217405 | 2/2002 |
| WO | WO03049204 | 6/2003 |
| WO | 2004003660 | 4/2004 |
| WO | WO2004027882 | 4/2004 |
| WO | WO2004044877 | 5/2004 |
| WO | WO 2004/053933 A2 | 6/2004 |
| WO | WO2005043627 A1 | 5/2005 |

(56) References Cited

FOREIGN PATENT DOCUMENTS

| | | |
|---|---|---|
| WO | WO2005104247 | 11/2005 |
| WO | WO2006016398 | 2/2006 |
| WO | WO2006054228 A3 | 5/2006 |
| WO | WO2006054228 | 6/2006 |
| WO | 2006135502 | 12/2006 |
| WO | WO 2007/083408 A1 | 7/2007 |
| WO | 2007121486 A2 | 10/2007 |
| WO | WO2007/127029 A2 | 11/2007 |
| WO | WO2007122516 | 11/2007 |
| WO | WO2008081794 A1 | 7/2008 |
| WO | WO2008082098 | 7/2008 |
| WO | WO 2009/074919 A1 | 6/2009 |
| WO | WO2010005294 | 1/2010 |
| WO | 2012099145 A1 | 7/2012 |

OTHER PUBLICATIONS

Office Action in related U.S. Appl. No. 12/002,410, dated: May 25, 2010.
Office Action in related U.S. Appl. No. 12/002,410, dated: Dec. 13, 2010.
Office Action in related U.S. Appl. No. 11/149,998, dated: May 11, 2011.
Office Action in related U.S. Appl. No. 11/149,998, dated: Aug. 27, 2010.
Office Action in related U.S. Appl. No. 11/149,998, dated: Jan. 24, 2011.
Office Action in related U.S. Appl. No. 11/149,998, dated: Nov. 20, 2009.
Response to OA in related U.S. Appl. No. 11/149,998, dated: Nov. 20, 2009, Response filed: Feb. 22, 2010.
Office Action in related U.S. Appl. No. 11/149,998, dated: May 18, 2010.
Office Action in related U.S. Appl. No. 12/291,293, dated: May 27, 2010.
Office Action in related U.S. Appl. No. 12/291,293, dated: Sep. 3, 2010.
Office Action in related U.S. Appl. No. 12/291,293, dated: Mar. 1, 2011.
Office Action in related U.S. Appl. No. 11/496,922, dated: Jun. 10, 2010.
Office Action in related U.S. Appl. No. 11/496,922, dated: Dec. 15, 2010.
Office Action in related U.S. Appl. No. 12/152,766, dated: Oct. 7, 2010.
Office Action in related U.S. Appl. No. 12/152,766, dated: Apr. 1, 2011.
Office Action in related U.S. Appl. No. 12/152,766, dated: Mar. 12, 2010.
Office Action in related U.S. Appl. No. 11/465,120, dated: Sep. 8, 2010.
Office Action in related U.S. Appl. No. 11/465,120, dated: Dec. 13, 2010.
Office Action in related U.S. Appl. No. 11/465,120, dated: Mar. 9, 2010.
Office Action in related U.S. Appl. No. 12/635,818, dated: Oct. 14, 2010.
Office Action in related U.S. Appl. No. 12/695,978, dated: Dec. 20, 2010.
Office Action in related U.S. Appl. No. 12/695,978, dated: May 10, 2011.
Office Action in related U.S. Appl. No. 12/069,827, dated: Oct. 29, 2010.
Office Action in related U.S. Appl. No. 12/069,827, dated: Apr. 20, 2010.
Office Action in related U.S. Appl. No. 12/069,827, dated: Jan. 27, 2011.
Office Action in related U.S. Appl. No. 12/154,691, dated: Dec. 17, 2009.
Response to OA in related U.S. Appl. No. 12/154,691, dated: Dec. 17, 2009, Response filed: May 17, 2010.
Office Action in related U.S. Appl. No. 12/321,059, dated: May 17, 2010.
Notice of Reasons for Rejection from Japanese Patent Application No. 2009-507195, dated May 8, 2012.
First Office Action for Chinese Patent Application No. 200980153995.2, dated May 4, 2012.
First Office Action for Chinese Patent Application No. 200910145412.3, dated Apr. 28, 2012.
Appeal Decision in Japanese Design Patent Application No. 2009-002857 (Appeal No. 2010-002154) mailed Aug. 20, 2010.
Office Action from U.S. Appl. No. 12/291,293, dated: Jul. 19, 2011.
Response to Office Action from U.S. Appl. No. 12/291,293, OA dated: Jul. 19, 2011, Resp. dated: Oct. 19, 2011.
Office Action from U.S. Appl. No. 11/465,120, dated: Jun. 14, 2011.
Office Action from U.S. Appl. No. 12/069,827, dated: Jun. 16, 2011.
Response to Office Action from U.S. Appl. No. 12/069,827, OA dated: Jul. 16, 2011, Resp. dated: Aug. 3, 2011.
Office Action from U.S. Appl. No. 12/321,059, dated: Jun. 22, 2011.
Response to Office Action from U.S. Appl. No. 12/321,059, OA dated: Jun. 22, 2011, Resp. dated: Aug. 22, 2011.
Office Action from U.S. Appl. No. 12/321,059, dated: Aug. 26, 2011.
Response to Office Action from U.S. Appl. No. 12/321,059, OA dated: Jun. 22, 2011, Resp. dated: Sep. 20, 2011.
Office Action from U.S. Appl. No. 11/496,922, dated: Jul. 5, 2011.
Office Action from U.S. Appl. No. 12/695,978, dated: Sep. 14, 2011.
Office Action from U.S. Appl. No. 11/149,998, dated: Sep. 21, 2011.
Office Action from U.S. Appl. No. 12/321,059, dated: Oct. 4, 2011.
Office Action from U.S. Appl. No. 12/069,827, dated: Oct. 26, 2011.
Notification of First Office Action in application CN 200880009255.7 mailed Sep. 26, 2010.
International Search Report and Written Opinion from PCT/CN2010/001009 mailed Oct. 21, 2010.
International Search Report and Written Opinion from PCT/US2010/001852 mailed Nov. 11, 2010.
Decision of Rejection for Japanese Patent Application No. 2007-211901, dated: Jan. 30, 2012.
Notification of the First Office Action from Chinese Patent Application No. 201010167346.2. dated Feb. 29, 2012.
First Office Action for Chinese Patent Application No. 201110039138.9, dated Jun. 4, 2012.
Decision of Rejection from Japanese Patent Application No. 2008-515699, dated Jul. 17, 2012.
Office Action from U.S. Appl. No. 11/465,120, mailed Dec. 9, 2011.
Office Action from U.S. Appl. No. 12/002,410, mailed Mar. 28, 2012.
Office Action from U.S. Appl. No. 12/002,410, mailed Dec. 21, 2011.
Response to Office Action for U.S. Appl. No. 12/002,410, filed Mar. 8, 2012.
Office Action from U.S. Appl. No. 12/757,179, mailed Jan. 19, 2012.
Office Action from U.S. Appl. No. 11/496,922, mailed Feb. 9, 2012.
Response to Office Action for U.S. Appl. No. 11/496,922, filed Apr. 6, 2012.
Advisory Action for U.S. Appl. No. 11/496,922, mailed Apr. 18, 2012.
Office Action from U.S. Appl. No. 12/321,059, mailed Feb. 10, 2012.
Response to Office Action for U.S. Appl. No. 12/321,059, filed Apr. 9, 2012.
Advisory Action from U.S. Appl. No. 12/321,059, mailed Apr. 20, 2012.
Office Action from U.S. Appl. No. 12/695,978, mailed Mar. 14, 2012.
Office Action from U.S. Appl. No. 11/982,275, mailed Mar. 23, 2012.
Office Action from U.S. Appl. No. 12/614,989, mailed Mar. 12, 2012.
Office Action from U.S. Appl. No. 12/069,827, mailed Apr. 3, 2012.
Notice of Reasons for Rejection for Japanese Patent Application No. JP 2008-515699 dated May 19, 2011.
Notice of Reasons for Rejection for Japanese Patent Application No. JP 2009-507195 dated Jun. 10, 2011.
Notice of Reasons for Rejection for Japanese Patent Application No. JP 2008-281533 dated Jun. 24, 2011.
First Office Action for Chinese Patent Application No. 200780019643.9, dated: Mar. 29, 2010.

(56) References Cited

OTHER PUBLICATIONS

International Search Report for PCT/CN2009/074800, mailed Feb. 25, 2010.
Office Action from related China Application No. 200710142310.7, dated: Dec. 11, 2009.
Declaration of Gerald Negley under 37 C.F.R. § 1.132, dated: Aug. 20, 2009.
Declaration of Charles Swoboda under 37 C.F.R. § 1.132, dated: Aug. 19, 2009.
Nichia Corp. White LED Part No. NSPW300BS, Specification for Nichia White LED, Model NSPW300BS., Jan. 14, 2004.
Nicha Corp., White LED Part No. NSPW312BS, Specification for Nichia White LED, Model NSPW312BS. Jan. 14, 2004.
Kim J.K et al. "Strongly Enhanced Phosphor Efficiency in GaInN White Light-Emitting Diodes Using Remote Phosphor Configuration and Diffuse Reflector Cup" Japanese Journal of Applied Physics, Japan Society of Applied Physics, Tokyo, JP, vol. 44, No. 20-23, Jan. 1, 2005 XP-001236966, pp. 649-651.
Preliminary Notice of Reasons for Refusal re related Japanese Application No. 2009-002857, dated: Jul. 24, 2009.
U.S. Appl. No. 11/473,089, filed Jun. 21, 2006, "Electronic Deposition of Semiconductor Devices".
Official Notice of Decision for Refusal regarding related Japanese Design Application No. 2009-002857, dated Oct. 30, 2009.
U.S. Appl. No. 11/656,759, filed Jan. 22, 2007, to Chitnis et al. "Wafer Level Phosphor Coating Method and Devices Fabricated Utilizing Method".
U.S. Appl. No. 11/899,790, filed Sep. 7, 2007, to Chitnis at al. "Wafer Level Phosphor Coating Method and Devices Fabricated Utilizing Method".
Cree XLamp® XR-E LEDS data page, retrieved at http://www.cree.com/products/xlamp7090_xre.asp on Sep. 15, 2010, pp. 1-3.
Cree XLamp® XR-C LEDs data page, retrieved at http://www.cree.com/products/xlamp_xrc.asp on Sep. 15, 2010, pp. 1-3.
Cree XLamp® XP-E LED data page, retrieved at http://www.cree.com/products/xlamp_xpe.asp on Sep. 15, 2010, pp. 1-4.
Cree XLamp® XP-G LED data page retrieved at http://www.cree.com/products/xlamp_xpg.asp on Sep. 15, 2010, pp. 1-3.
Cree XLamp® MC-E LED data page retrieved at http://www.cree.com/products/xlamp_mce.asp on Sep. 15, 2010, pp. 1-3.
Office Action from U.S. Appl. No. 12/321,059, dated: May 17, 2010.
Response to Office Action from U.S. Appl. No. 12/321,059 dated: May 17, 2010.
Office Action from U.S. Appl. No. 12/321,059, dated: Sep. 24, 2010.
Response to Office Action from U.S. Appl. No. 12/321,059 dated: Nov. 23, 2010.
Response to Office Action from U.S. Appl. No. 12/321,059 dated: Dec. 22, 2010.
Office Action from U.S. Appl. No. 12/154,691, dated: Dec. 17, 2009.
Response to Office Action from U.S. Appl. No. 12/154,691, dated: May 17, 2009.
Notice of Allowance for U.S. Appl. No. 12/154,691, dated: Jun. 17, 2010.
Office Action from U.S. Appl. No. 11/465,120, dated: Aug. 21, 2008.
Response to Office Action from U.S. Appl. No. 11/465,120, dated: Nov. 21, 2008.
Office Action from U.S. Appl. No. 11/465,120, dated: Feb. 20, 2009.
Response to Office Action from U.S. Appl. No. 11/465,120, dated: Apr. 20, 2009.
Office Action from U.S. Appl. No. 11/465,120, dated: May 4, 2009.
Response to Office Action from U.S. Appl. No. 11/465,120, dated: Jun. 22, 2009.
Office Action from U.S. Appl. No. 11/465,120, dated: Jul. 21, 2009.
Response to Office Action from U.S. Appl. No. 11/465,120, dated: Oct. 21, 2009.
Response to Office Action from U.S. Appl. No. 11/465,120, dated: Dec. 1, 2009.
Office Action from U.S. Appl. No. 11/465,120, dated: Mar. 9, 2010.
Response to Office Action from U.S. Appl. No. 11/465,120, dated: Jun. 9, 2010.
Office Action from U.S. Appl. No. 11/465,120, dated: Sep. 8, 2010.
Response to Office Action from U.S. Appl. No. 11/465,120, dated: Nov. 8, 2010.
Office Action from U.S. Appl. No. 11/465,120, dated: Nov. 16, 2010.
Response to Office Action from U.S. Appl. No. 11/465,120, dated: Dec. 1, 2010.
Office Action from U.S. Appl. No. 11/465,120, dated: Dec. 13, 2010.
Office Action from U.S. Appl. No. 11/149,998, dated: Jan. 8, 2007.
Response to Office Action from U.S. Appl. No. 11/149,998, dated: Jun. 8, 2007.
Office Action from U.S. Appl. No. 11/149,998, dated: Aug. 17, 2007.
Response to Office Action from U.S. Appl. No. 11/149,998, dated: Dec. 17, 2007.
Office Action from U.S. Appl. No. 11/149,998, dated: Feb. 5, 2008.
Response to Office Action from U.S. Appl. No. 11/149,998, dated: May 5, 2008.
Office Action from U.S. Appl. No. 11/149,998, dated: Jul. 21, 2008.
Response to Office Action from U.S. Appl. No. 11/149,998, dated: Oct. 21, 2008.
Office Action from U.S. Appl. No. 11/149,998, dated: Jan. 5, 2009.
Response to Office Action from U.S. Appl. No. 11/149,998, dated: Apr. 3, 2009.
Office Action from U.S. Appl. No. 11/149,998, dated: Jul. 14, 2009.
Response to Office Action from U.S. Appl. No. 11/149,998, dated: Oct. 14, 2009.
Office Action from U.S. Appl. No. 11/149,998, dated: Nov. 20, 2009.
Response to Office Action from U.S. Appl. No. 11/149,998, dated: Feb. 22, 2010.
Office Action from U.S. Appl. No. 11/149,998, dated: May 18, 2010.
Response to Office Action from U.S. Appl. No. 11/149,998, dated: Aug. 2, 2010.
Office Action from U.S. Appl. No. 11/149,998, dated; Aug. 27, 2010.
Response to Office Action from U.S. Appl. No. 11/149,998, dated: Nov. 19, 2010.
Office Action from U.S. Appl. No. 12/069,827, dated: Apr. 20, 2010.
Response to Office Action from U.S. Appl. No. 12/069,827, dated: Sep. 20, 2010.
Office Action from U.S. Appl. No. 12/069,827, dated: Oct. 29, 2010.
Office Action from U.S. Appl. No. 29/293,900, dated: Apr. 5, 2010.
Office Action from U.S. Appl. No. 29/293,900, dated: Sep. 24, 2010.
Notice of Allowance from U.S. Appl. No. 29/293,900, dated: Jul. 21, 2010.
Office Action from U.S. Appl. No. 12/152,766, dated: Mar. 12, 2010.
Response to Office Action from U.S. Appl. No. 12/152,766, dated: Sep. 13, 2010.
Office Action from U.S. Appl. No. 12/152,766, dated: Oct. 7, 2010.
Notice of Reasons for Rejection for Japanese Patent Application No. 2007-211901 dated Apr. 14, 2011.
International Preliminary Report on Patentability for PCT/CN2010/070073 mailed Apr. 28, 2011.
International Search Report and Written Opinion for PCT/CN2010/001865 mailed Jun. 9, 2011.
First Office Action for Chinese Patent Application No. CN 200710152109.7 issued Jul. 29, 2011.
Extended Supplementary European Search Report for EP Application No. EP 07789665.2 dated Nov. 7, 2011.
Second Office Action for Chinese Patent Application No. CN200880009255.7 mailed Oct. 13, 2011.
International Search Report and Written Opinion for counterpart PCT Application No. PCT/US2011/001457 mailed Dec. 13, 2011.
Interrogation from Japanese Patent Application No. 2207-211901. dated Aug. 21, 2012.
Examination Report from European Patent Application No. 07789665.2, dated Aug. 20, 2012.
Decision of Rejection from Chinese Patent Application No. 200880009255.7, dated Sep. 5, 2012.
First Office Action from Chinese Patent Application No. 201080001658.4, dated Sep. 24, 2012.
Notice of Reasons for Rejection from Japanese Patent Application No. 2007-211901, dated Apr. 9, 2013.
Decision of Rejection from Japanese Patent Application No. 2011-545616, dated Apr. 26, 2013.

(56) References Cited

OTHER PUBLICATIONS

Extended Search Report for European Patent Application No. 09824413.0-1551, dated Feb, 11. 2013.
Second Office Action from Chinese Patent Appl. No. 201110039138.9, dated Jan. 31, 2013.
International Search Report and Written Opinion from PCT application No. PCT/US2012/065060, dated Feb. 20, 2013.
Third Office Action from Chinese Patent Application No. 200710152109.7, dated: Mar. 5, 2013.
Interrogation from Japanese Patent Application No. 2008-515699, dated Feb. 19. 2013.
Communication from European Patent Appl. No. 09824413.0-1551, dated Feb. 28, 2013.
European Search Report from European Patent Appl. No. 09824413.0-1551, dated Feb. 11, 2013.
Notice of Reasons for Rejection from Japanese Patent Appl. No. 2011-534993, dated Mar. 12, 2013.
Notification of the Second Office Action from Chinese Patent Application No. 201010167346.2, dated Feb. 17, 2013.
Decision of Rejection from Japanese Patent Application No. 2009-507195, dated May 21, 2013.
Notice of Reasons for Rejection from Japanese Patent Appl. No. 2011-259253, dated May 28, 2013.
Decision of Rejection from Japanese Patent Appl. No. 2008-281533, dated May 28, 2013.
Decision of Rejection from Chinese Patent Appl. No. 201080001658.4, dated Jun. 20, 2013.
Office Action from U.S. Appl. No. 12/875,873, dated Jul. 3, 2013.
Office Action from U.S. Appl. No. 11/496,922, dated Jun. 26, 2013.
Office Action from U.S. Appl. No. 12/757,891, dated Jun. 18, 2013.
Office Action from U.S. Appl. No. 11/982,275, dated May 9, 2013.
Office Action from U.S. Appl. No. 12/069,827, dated Mar. 5, 2013.
Response to OA from U.S. Appl. No. 12/069,827, filed Jun. 5, 2013.
Office Action from U.S. Appl. No. 11/149,998, dated Apr. 3, 2013.
Response to OA from U.S. Appl. No. 11/149,998, filed Jun. 25, 2013.
Office Action from U.S. Appl. No. 11/982,275, dated Sep. 18, 2012.
Response to OA from U.S. Appl. No. 11/982,275, filed Sep. 27, 2012.
Office Action from U.S. Appl. No. 12/002,410, dated Sep. 25, 2012.
Response to OA from U.S. Appl. No. 12/002,410, filed Dec. 18, 2012.
Office Action from U.S. Appl. No. 12/069,827, dated Aug. 9, 2012.
Response to OA from U.S. Appl. No. 12/069,827, filed Nov. 9, 2012.
Office Action from U.S. Appl. No. 11/465,120, dated Aug. 21, 2012.
Response to OA from U.S. Appl. No. 11/465,120, filed Aug. 24, 2012.
Office Action from U.S. Appl. No. 12/875,873, dated Aug. 22, 2012.
Response to OA from U.S. Appl. No. 12/875,873, filed Nov. 19, 2012.
Office Action from U.S. Appl. No. 11/465,120, dated Jun. 19, 2012.
Response to OA from U.S. Appl. No. 11/465,120, filed Aug. 15, 2012.
Office Action from U.S. Appl. No. 11/982,275, dated Jul. 9, 2012.
Response to OA from U.S. Appl. No. 11/982,275, filed Sep. 18, 2012.
Office Action from U.S. Appl. No. 12/757,179, dated Jul. 16, 2012.
Response to OA from U.S. Appl. No. 12/757,179, filed Sep. 25, 2012.
Office Action from U.S. Appl. No. 12/069,827, dated Dec. 6, 2012.
Response to OA from U.S. Appl. No. 12/069,827, filed Jan. 29, 2013.
Office Action from U.S. Appl. No. 11/982,275, dated Nov. 28, 2012.
Response to OA from U.S. Appl. No. 11/982,275, filed Mar. 21, 2013.
Office Action from U.S. Appl. No. 11/496,922, dated Nov. 23, 2012.
Response to OA from U.S. Appl. No. 11/496,922, filed Apr. 23, 2013.
Office Action from U.S. Appl. No. 12/757,891, dated Nov. 28, 2012.
Response to OA from U.S. Appl. No. 12/757,891, filed Jan. 28, 2013.
Office Action from U.S. Appl. No. 13/306,589, dated Feb. 20, 2013.
Response to OA from U.S. Appl. No. 13/306,589, filed May 16, 2013.
Office Action from U.S. Appl. No. 12/002,410, dated Jan. 29, 2013.
Response to OA from U.S. Appl. No. 12/002,410, filed Apr. 18, 2013.
Office Action from U.S. Appl. No. 12/875,873, dated Feb. 21, 2013.
Response to OA from U.S. Appl. No. 12/875,873, filed Apr. 19, 2013.
Office Action from U.S. Appl. No. 12/291,293, dated Feb. 28, 2013.
Response to OA from U.S. Appl. No. 12/291,293, filed Jun. 5, 2013.
Office Action from U.S. Appl. No. 12/695,978, dated Apr. 18, 2013.
Response to OA from U.S. Appl. No. 12/695,978, filed Jul. 10, 2013.
CREE® XLAMP® MC-E LEDS Product Info Sheets, pp. 1-3, 2008.
Nichia Corporation LEDS, Models NSSM016G, NSSM227, NESM026X, NSSM026BB, NESM005A, 9 Pages, 2010.
Appeal Decision from Japanese Patent Appl. No. 2008-515699, dated Sep. 20, 2013.
Decision of Rejection from Chinese Patent Appl. No. 201001067346.2, dated Aug. 30, 2013.
Office Action from Japanese Patent Appl. No. 2012-288000, dated Oct. 8, 2013.
Decision of Rejection from Chinese Patent Appl. No. 201110039138.9 dated Sep. 25, 2013.
Office Action from U.S. Appl. No. 12/695,978, dated Sep. 17, 2013.
Office Action from U.S. Appl. No. 13/652,241, dated Sep. 11, 2013.
Office Action from U.S. Appl. No. 12/002,410, dated Sep. 10, 2013.
Fourth Office Action from Chinese Patent Appl. No. 200710152109.7, dated Jun. 28, 2013.
Office Action from U.S. Appl. No. 11/149,998, dated Jul. 26, 2013.
Office Action from U.S. Appl. No. 11/982,275, dated Aug. 8, 2013.
Office Action from U.S. Appl. No. 12/069,827, dated Jul. 3, 2013.
Office Action from U.S. Appl. No. 12/291,293, dated Aug. 20, 2013.
Notice of Reasons for Rejection from Japanese Patent Appl. No. 2007-211901, dated Oct. 8, 2013.
Notification of Loss of Rights from European Patent Appl. No. 09824413.0, dated Oct. 17, 2013.
Appeal board's Questioning from Japanese Patent Appl. No. 2011-545616, dated Nov. 12, 2013.
Office Action from U.S. Appl. No. 12/069,827, dated Oct. 25, 2013.
Office Action from U.S. Appl. No. 11/496,922, dated Oct. 9, 2013.
Office Action from U.S. Appl. No. 12/875,873, dated Oct. 18, 2013.
Interrogation from Japanese Patent Appl. No. 2009-507195. dated Jan. 28, 2014.
Notification of Designation of the Appeal Examiner from Japanese Patent Appl. No. 2009-507195, dated Jan. 22. 2014.
Interrogation from Japanese Patent Appl. No. 2008-281533, dated Jan. 21, 2014.
International Search Report and Written Opinion from PCT/US2013/073921, dated Feb. 18. 2014.
Decision of Registration from Japanese Design Appl. No. 2012-030304, dated Jan. 21, 2014.
Office Action from U.S. Appl. No. 11/982,275. dated Jan. 7, 2014.
Office Action from U.S. Appl. No. 12/291,293. dated Dec. 31, 2013.
Fifth Office Action from Chinese Patent Appl. No. 2007/10152109.7, dated Jan, 6. 2014.
Supplemental European Search Report from European Patent Appl. No. 10731037,7, dated Jan. 9, 2014.
Search Report for European Patent Appl. No. 10731037.7, dated Dec. 11, 2013.
Notice of Reasons for Rejection from Japanese Patent Appl. No. 2011-534993, dated Nov. 12, 2013.

* cited by examiner

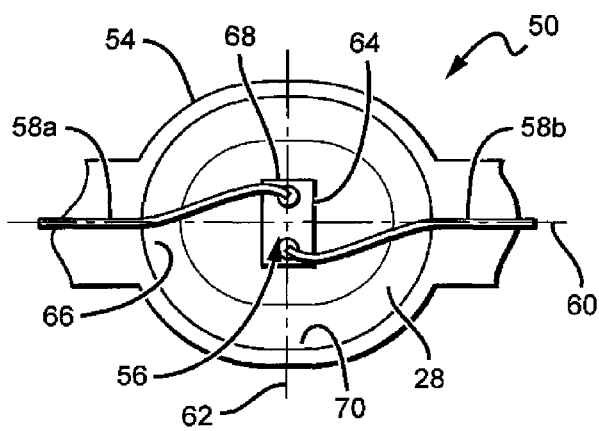
FIG. 4
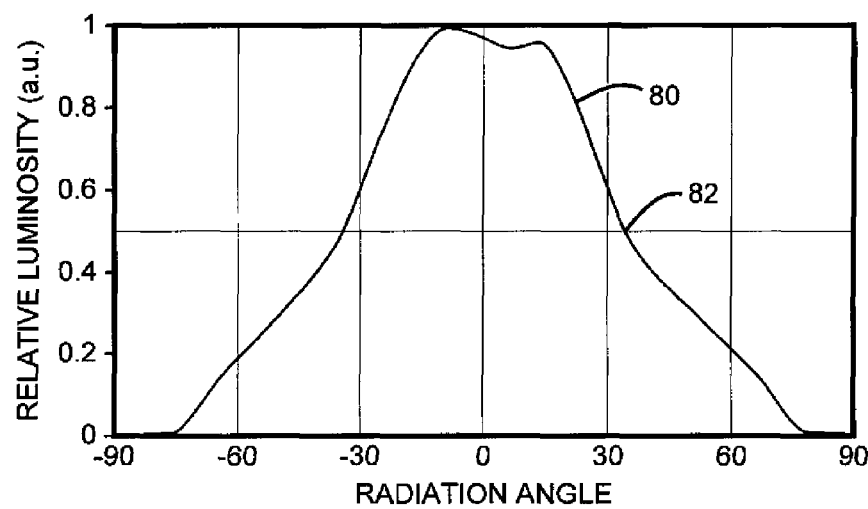
FIG. 5
FIG. 6
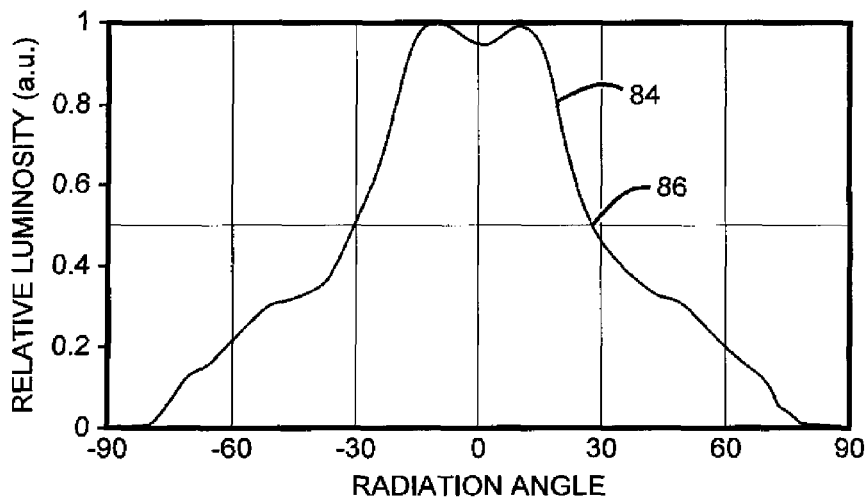

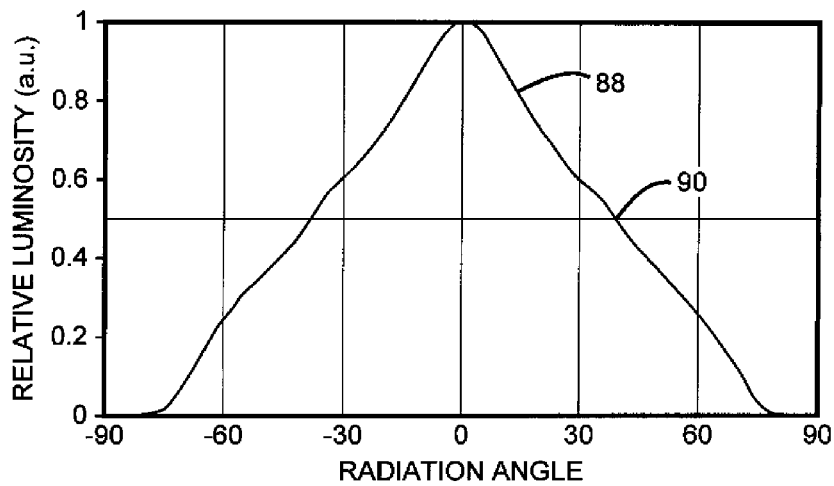
FIG. 7
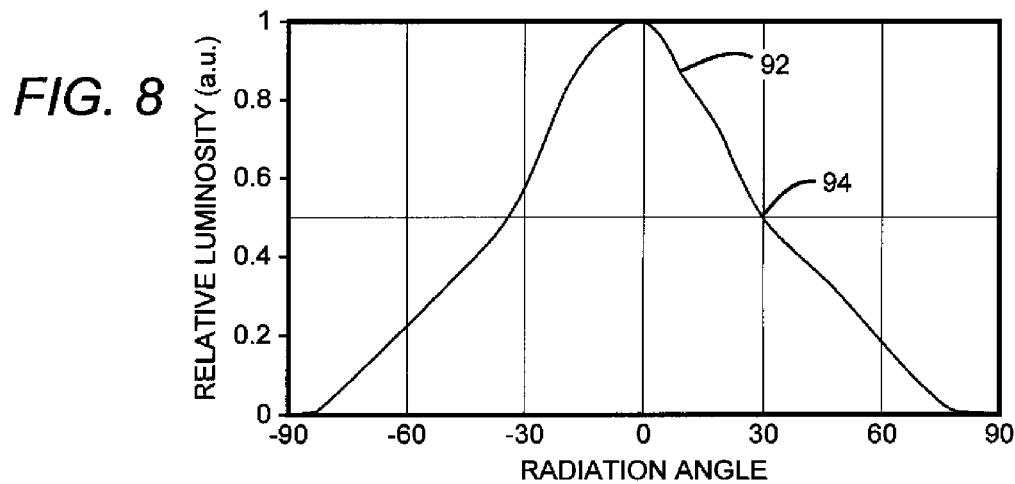
FIG. 8
FIG. 9
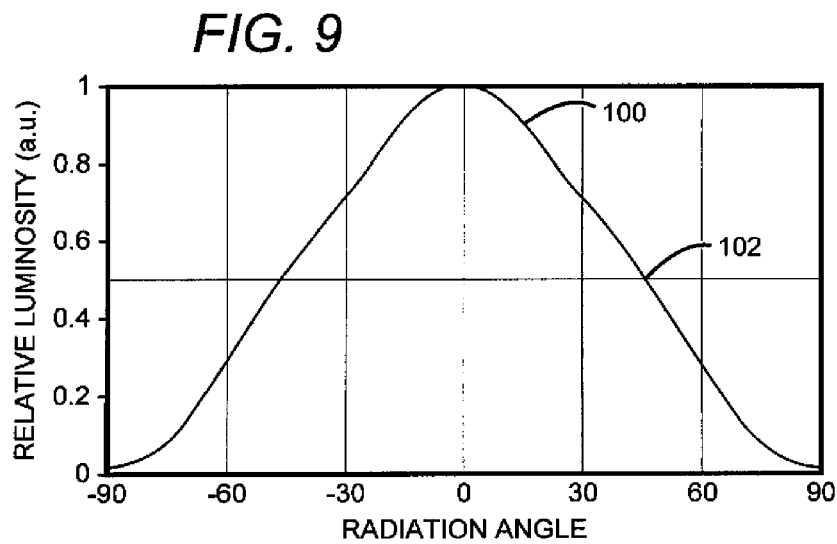

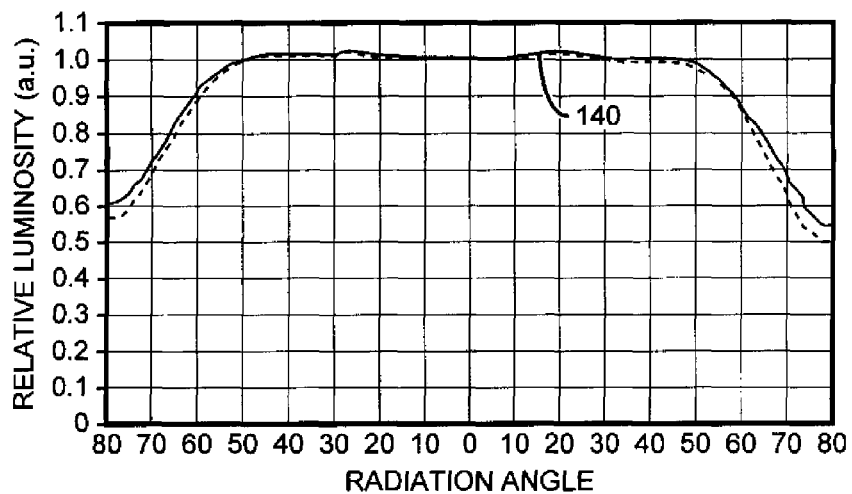
FIG. 19
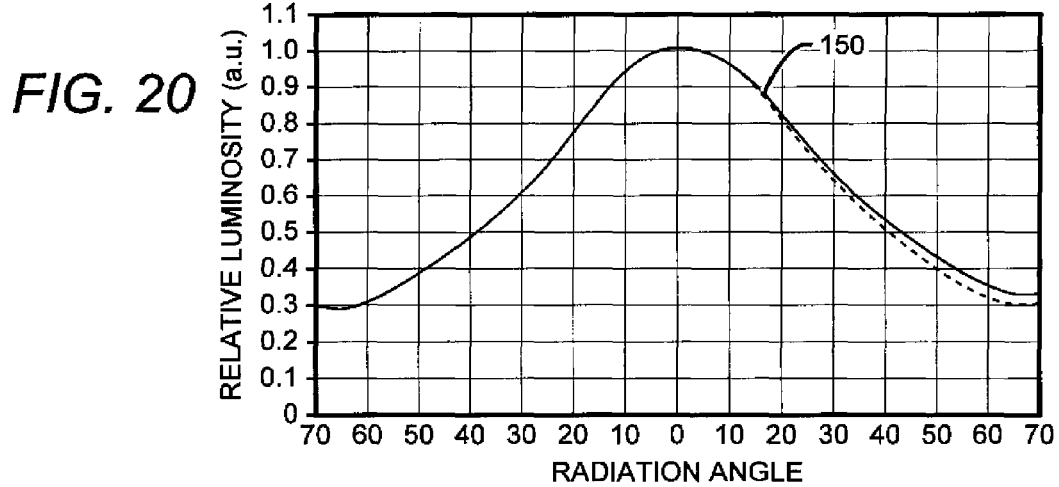
FIG. 20
FIG. 21
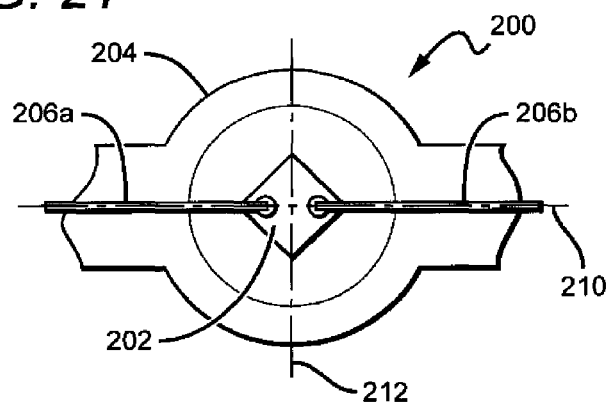

FIG. 22
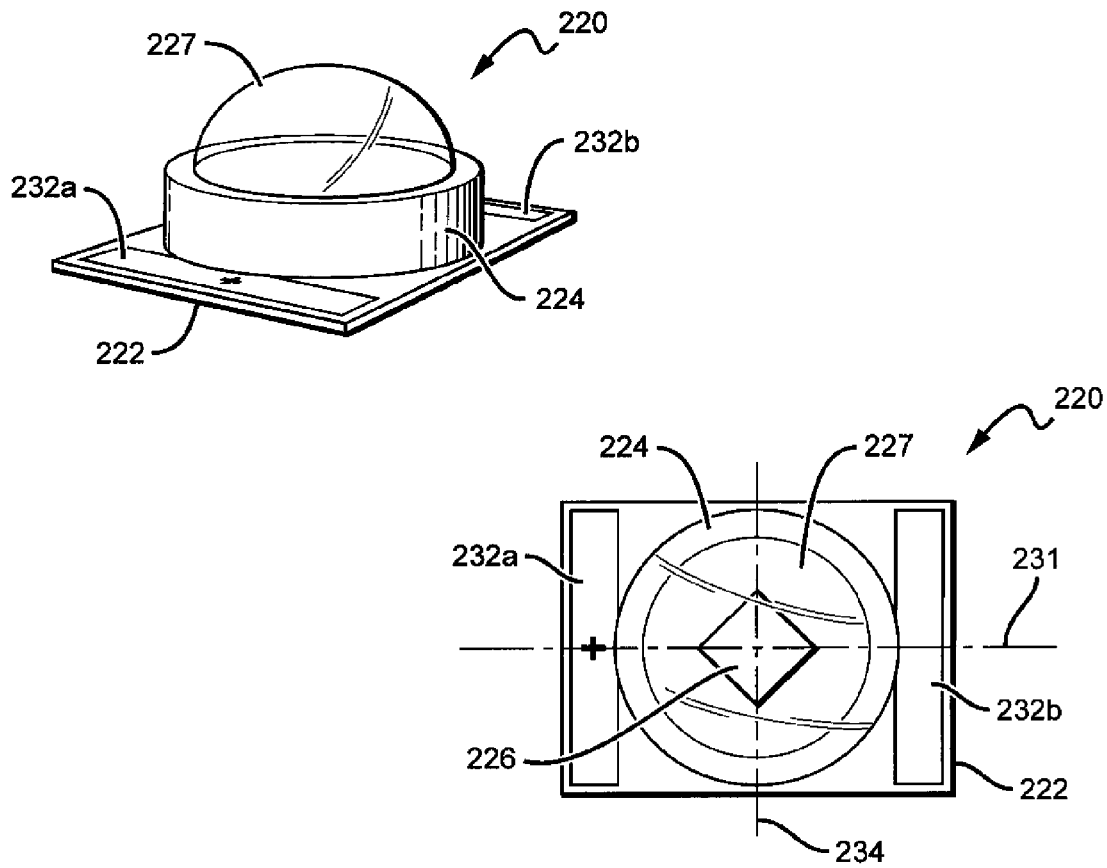
FIG. 23
FIG. 24
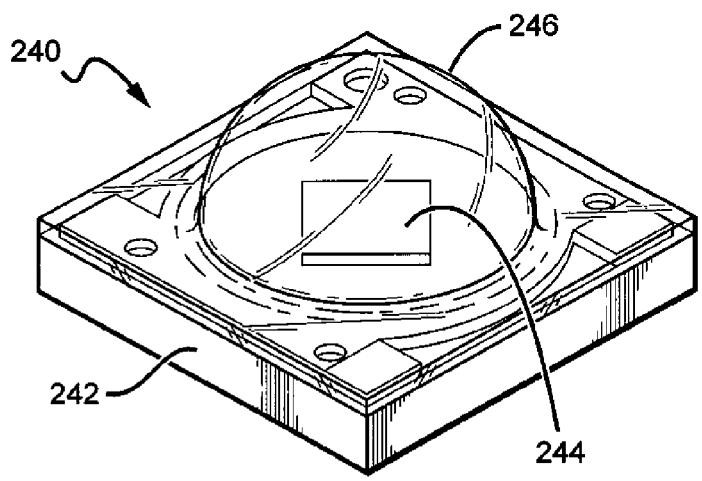

EMITTER PACKAGE WITH ANGLED OR VERTICAL LED

This application is a continuation in part of U.S. patent application Ser. No. 12/635,818, (now Pat. No. 8,362,512), filed on Dec. 11, 2009, entitled "Side View Surface Mount White LED", which is a continuation of U.S. patent application Ser. No. 11/739,307, filed on Apr. 24, 2007 (now Pat. No. 7,649,209), also entitled "Side View Surface Mount White LED", which claims the benefit of U.S. Provisional Application No. 60/745,478, filed on Apr. 24, 2006.

BACKGROUND OF THE INVENTION

1. Field of the Invention

This invention relates to light emitting diode packages and displays utilizing light emitting diode packages as their light source.

2. Description of the Related Art

Light emitting diodes (LED or LEDs) are solid state devices that convert electric energy to light, and generally comprise one or more active layers of semiconductor material sandwiched between oppositely doped layers. When a bias is applied across the doped layers, holes and electrons are injected into the active layer where they recombine to generate light. Light is emitted from the active layer and from all surfaces of the LED.

Technological advances over the last decade or more has resulted in LEDs having a smaller footprint, increased emitting efficiency, and reduced cost. LEDs also have an increased operation lifetime compared to other emitters. For example, the operational lifetime of an LED can be over 50,000 hours, while the operational lifetime of incandescent bulb is approximately 2,000 hours. LEDs can also be more robust than other light sources and can consume less power. For these and other reasons, LEDs are becoming more popular and are now being used in more and more applications that have traditionally been the realm of incandescent, fluorescent, halogen and other emitters.

In order to use an LED chip in conventional applications it is known to enclose an LED chip in a package to provide environmental and/or mechanical protection, color selection, light focusing and the like. An LED package also includes electrical leads, contacts or traces for electrically connecting the LED package to an external circuit. In a typical two-pin LED package/component 10 illustrated in FIG. 1, a single LED chip 12 is mounted on a reflective cup 13 by means of a solder bond or conductive epoxy. One or more wire bonds 11 connect the ohmic contacts of the LED chip 12 to leads 15A and/or 15B, which may be attached to or integral with the reflective cup 13. The reflective cup 13 may be filled with an encapsulant material 16 and a wavelength conversion material, such as a phosphor, can be included over the LED chip or in the encapsulant. Light emitted by the LED at a first wavelength may be absorbed by the phosphor, which may responsively emit light at a second wavelength. The entire assembly can then be encapsulated in a clear protective resin 14, which may be molded in the shape of a lens to direct or shape the light emitted from the LED chip 12.

FIG. 2 shows a top view of a conventional LED package 20 similar to the package 10 shown in FIG. 1 and including an LED chip 22 mounted at the base of a reflective cup 24. Wire bonds 26a and 26b are included to connect to the ohmic contacts of the LED chip 22, and the reflective cup 24 is filed with an encapsulant material 28. In package 20, the reflective cup 24 is oval shaped and the LED chip 22 is rectangular shaped, with the LED chip 22 and reflective cup 24 being longitudinally aligned. That is, longer edges of the LED chip are aligned with the reflective cup axis running along the elongated direction of the reflective cup.

Different LEDs packages, such as those shown in FIGS. 1 and 2, can be used as the light source for displays, both big and small. Large screen LED based displays (often referred to as giant screens) are becoming more common in many indoor and outdoor locations, such as at sporting arenas, race tracks, concerts and in large public areas such as Times Square in New York City. With current technology, some of these displays or screens can be as large as 60 feet tall and 60 feet wide. As technology advances it is expected that larger screens will be developed.

These screens can comprise thousands of "pixels" or "pixel modules", each of which can contain a plurality of LEDs. The pixel modules can use high efficiency and high brightness LEDs that allow the displays to be visible from relatively far away, even in the daytime when subject to sunlight. The pixel modules can have as few as three or four LEDs (one red, one green, and one blue) that allow the pixel to emit many different colors of light from combinations of red, green and/or blue light. In the largest jumbo screens, each pixel module can have dozens of LEDs. The pixel modules are arranged in a rectangular grid. In one type of display, the grid can be 640 modules wide and 480 modules high, with the size of the screen being dependent upon the actual size of the pixel modules.

Most conventional LED based displays are controlled by a computer system that accepts an incoming signal (e.g. TV signal) and based on the particular color needed at the pixel module to form the overall display image, the computer system determines which LED in each of the pixel modules is to emit light and how brightly. A power system can also be included that provides power to each of the pixel modules and the power to each of the LEDs can be modulated so that it emits at the desired brightness. Conductors are provided to apply the appropriate power signal to each of the LEDs in the pixel modules.

LED displays are rarely mounted at the viewer's eye level, and are more typically mounted at an elevation above eye level, such as on the side of a building or the top of the grandstands in a stadium. Referring now to FIG. 3, a conventional LED display 30 is shown mounted at an elevated point above the eye level of the viewer 32. The viewer 32 is typically positioned below the display 30 and looks up to the display such that the viewer's line of sight 34 to the display 30 is at an angle θ to the display's perpendicular emission direction 36. The LED display in FIG. 3 typically comprises a plurality of emitters 38 such as those shown in FIGS. 1 and 2 that exhibit a peak emission that is near the center of the horizontal and vertical axis.

Having a display comprising a plurality of LED packages 38 can result in display peak emission characteristics emitting in the perpendicular direction 36, as shown. The Iv and far field pattern (FFP) peak emission characteristics for the LED display 30 can be perpendicular to the display along the perpendicular axis 36. The viewer's line of sight 34 is below perpendicular when the display 30 is mounted at an elevated point; much of the light emitted by the display is not seen by the viewer and is wasted. This can be true for viewers below the display and the side of the display. One way to reduce the amount of light that is wasted is by mounting the display at an angle to better match the viewer's line of sight 34, but this can require complex and expensive mounting hardware that is difficult to use, particularly for very large displays mounted at high elevations.

Viewers are often not directly in front of an LED based display when it is viewed. Depending on where the viewer is located the horizontal viewing angle can be different. Furthermore, when a person is moving by an LED display, such as walking by, it is viewed at many different horizontal angles. Typical LED displays with peak emissions near the center can experience a drop-off in emission intensity at different horizontal angles. The far field pattern (FFP) for the different LED packages in each of the pixels can also be different such that the LED display can experience image quality variations when viewed from different angles.

Because of this, it can be important for the FFP emission characteristics of the red, green and blue LED packages used in LED displays pixels to be smooth, as wide as possible, and matched between the red, green, and blue colors. Standard geometry LED packages as shown in FIGS. 1 and 2 allow for the longest reflection surface of the reflector cup (wide viewing angle) to be parallel with the longest emission side of the chip (wide viewing angle). This geometry also allows the shortest reflection surface of the reflector cup (narrow emitting angle) to be parallel with the shortest emission side of the chip (narrow viewing angle). This geometry also minimizes bond wire length, which can help minimize the wire bond failure rate. The challenge with this arrangement is that it can require a near perfect match between the LED chip far-field pattern, the reflective cope and LED dome. Without this perfect match a large amount of diffuser can be necessary in the dome or encapsulant. Diffusers, however, can absorb light emitting from the packages, and thereby can reduce the emission brightness.

SUMMARY OF THE INVENTION

The present invention is directed to LED packages and LED displays utilizing the LED packages, wherein the LED chip or LED chips within the packages are arranged in unique orientations to provide the desired package or display FFP characteristics. One embodiment of an LED package according to the present invention comprises a reflective cup and an LED chip mounted in the reflective cup. The reflective cup has a first axis and a second axis that is orthogonal to the first axis, wherein the LED chip is rotated within the reflective cup so that the LED chip is out of alignment with the first axis.

Another embodiment of an LED package according to the present invention comprises a substrate and an LED chip mounted on the substrate. The substrate has a first longitudinal axis, and the LED chip is mounted on the substrate so that the LED chip is out of alignment with the first axis.

Another embodiment of an LED package according to the present invention comprises a rectangular LED chip having a chip longitudinal axis and an oval shaped reflective cup having a cup longitudinal axis. The LED chip is mounted within the reflective cup with the chip longitudinal axis angled from the cup longitudinal axis.

The LED packages according to the present invention can be arranged in LED displays to provide the desired display FFPs. These and other aspects and advantages of the invention will become apparent from the following detailed description and the accompanying drawings which illustrate by way of example the features of the invention.

BRIEF DESCRIPTION OF THE DRAWINGS

FIG. 4 is a top view of one embodiment of an LED package according to the present invention;

FIG. 5 is a graph showing the horizontal far-field pattern (FFP) for a conventional LED package;

FIG. 6 is a graph showing the vertical FFP for a conventional LED package;

FIG. 7 is a graph showing the horizontal FFP for one embodiment of an LED package according to the present invention;

FIG. 8 is a graph showing the vertical FFP for one embodiment of an LED package according to the present invention;

FIG. 9 is a graph showing the horizontal far-field pattern (FFP) for a conventional LED package;

FIG. 19 is a graph showing the FFP for an LED display according to the present invention;

FIG. 20 is a graph showing the FFP for an LED display according to the present invention;

FIG. 21 is a top view of another embodiment of an LED package according to the present invention;

FIG. 22 is a perspective view of another embodiment of an LED package according to the present invention;

FIG. 23 is the top view of the LED package shown in FIG. 22;

FIG. 24 is a perspective view of another embodiment of an LED package according to the present invention;

DETAILED DESCRIPTION OF THE INVENTION

The present invention is directed to LED packages and LED displays utilizing LED packages where the LED chips or chips within the packages can be angled or rotated in relation to the package (or other features as described below) to provide the desired emission characteristics. In some embodiments the desired characteristics can include wider horizontal and/or vertical FFP for the LED packages, while in other embodiments the desired characteristics can include placing of FFP asymmetries in the desired location in the FFP. These can provide improved picture intensity and quality when viewing the packages and/or displays at different viewing angles. Rotating the LED chip can also result in a smoother, more uniform FFP compared to LED packages with conventionally oriented LED chips. Rotating the chips also allow for a better match of the chip far-field emission with the reflector cup characteristics, to provide repeatable manufacturing of LED packages with similar desired emission characteristics. That is, an LED package can be provided with a more uniform FFP pattern, while at the same time allowing for more consistent package to package emission uniformity.

There are also a number of other advantages provided by the present invention. By rotating the LED chip in LED packages according to the present invention, the amount of diffuser necessary to optimize the FFP can also be reduced. This can result in an LED display having a more intense video screen oval because less LED light is absorbed by the diffuser. Rotating the LED chip and reducing the amount of diffuser can also provide an LED chip with a smooth viewing angle light emission pattern.

Figure 2:
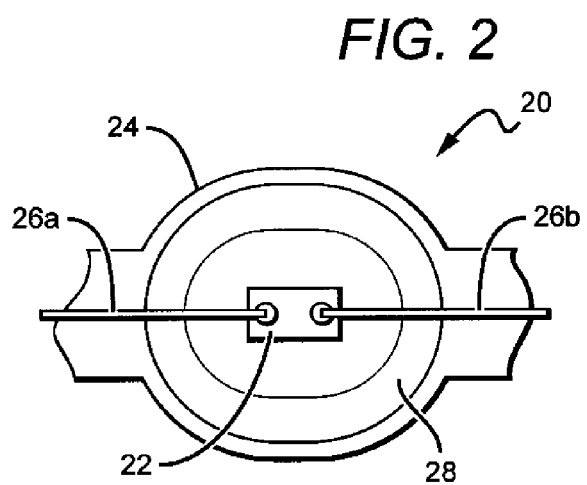
FIG. 2 is a top view of a conventional light emitting diode package.
Figure 3:
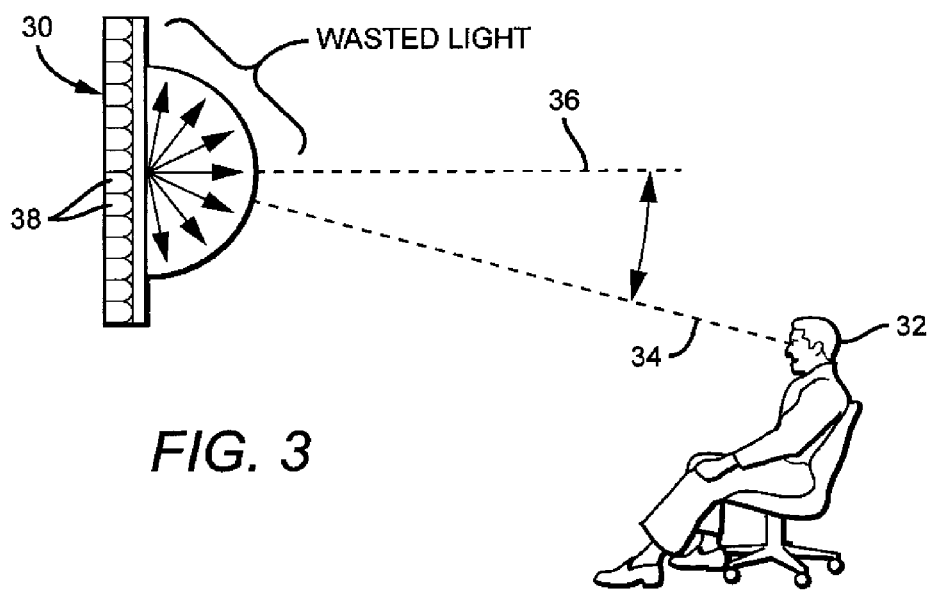
FIG. 3 is a schematic showing a LED display and a typical viewing angle.

In one embodiment having an oval reflective cup and a rectangular LED chip as shown in FIG. 2, rotating the LED chip so that is vertical or orthogonal to the reflective cup's longitudinal axis allows the longest reflection surface of the reflective cup (wide viewing angle) to be parallel with the shorter emission side of the chip (narrow viewing angle). It also allows for the shortest reflection surface of the reflective cup (narrow viewing angle) to be parallel with the longer emission side of the chip (wide viewing angle). This can result in longer wire bonds, which can require closer fabrication focus to provide packages with good reliability. However, this package geometry can provide the advantage of relaxing the match criteria necessary for conventional LED packages between the LED chip far-field pattern, reflective cup and LED dome. It can also reduce the need for large amounts of diffusers. Some embodiments can comprise an oval shaped reflective cup and rectangular LED chip with the LED chip out of alignment with the longitudinal axis of the reflective cup.

Other embodiments of LED packages according to the present invention can have reflective cups that have different shapes, such as round, square, rectangular, or other polygon shapes. The LED chips used in different packages can have different shapes, such as square, circular, oval, rectangular or other polygon shapes. For example, in another embodiment according to the present invention, the reflective cup can be circular and the LED chips can be square, with the LED chip rotated and an angle to the axis of the reflective cup or the LED package. It is also understood that LED packages according to the present invention can be arranged without reflective cups with the LED chip mounted on a substrate or submount, and other LED packages can comprise LED chip arrays instead of a single LED chip.

The above embodiments can be described herein with reference to reflective cups with one axis that is longer than its orthogonal axis. The present invention however is equally applicable to embodiments having a package, substrate, submount or lens with one axis that is longer than its orthogonal axis. Stated differently, it is understood that the present invention is applicable to packages, substrates and submounts having a longer and a shorter orthogonal axis or a package having a lens, with the lens having a longer and shorter orthogonal axis. In these embodiments, the LED chip is rotated out of alignment with the longer axis or rotated such that it is out of alignment with both the longer and shorter axis.

The present invention is described herein with reference to certain embodiments, but it is understood that the invention can be embodied in many different forms and should not be construed as limited to the embodiments set forth herein. In particular many different LED, reflective cup and lead frame arrangements can be provided beyond those described above, and the encapsulant can provide further features to improve the reliability and emission characteristics from the LED packages and LED displays utilizing the LED packages.

Although some of the embodiments are described herein with reference to a reflective cup, it is understood that the present invention is equally applicable to any embodiments having any type of reflective cavity, or no reflective cup. Although the different embodiments of LED packages discussed below are directed to use in LED displays, they can be used in many other applications either individually or with other LED packages having the same or different peak emission tilt.

It is also understood that when an element such as a layer, region or substrate is referred to as being "on" another element, it can be directly on the other element or intervening elements may also be present. Furthermore, relative terms such as "above" and "below", and similar terms, may be used herein to describe a relationship of one layer or another region. It is understood that these terms are intended to encompass different orientations of the device in addition to the orientation depicted in the figures.

Although the terms first, second, etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the present invention.

Embodiments of the invention are described herein with reference to cross-sectional view illustrations that are schematic illustrations of embodiments of the invention. As such, the actual thickness of the layers can be different, and variations from the shapes of the illustrations as a result, for example, of manufacturing techniques and/or tolerances are expected. Embodiments of the invention should not be construed as limited to the particular shapes of the regions illustrated herein but are to include deviations in shapes that result, for example, from manufacturing. A region illustrated or described as square or rectangular will typically have rounded or curved features due to normal manufacturing tolerances. Thus, the regions illustrated in the figures are schematic in nature and their shapes are not intended to illustrate the precise shape of a region of a device and are not intended to limit the scope of the invention.

Figure 1:
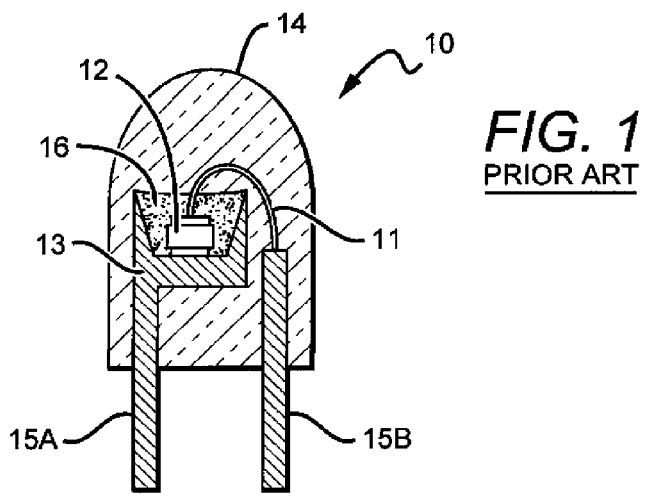
FIG. 1 is a side view of a conventional light emitting diode package.

FIG. 4 shows one embodiment of LED package 50 according to the present invention that generally comprises a reflective cup 54, with an LED chip 56 mounted at the base of the reflective cup 54. In pin mounted embodiments, the LED package can comprise a two-pin lead frame (not shown but similar to those shown in FIG. 1) that can be made of conventional materials using known manufacturing methods. An electrical signal can be applied to the LED 56 through the two pins of the lead frame section, with wire bonds 58a, 58b providing an electrical path between the lead frame and the LED 56 to carry an electrical signal to the LED 56 that causes it to emit light.

Many different types of LEDs or LED chips ("LED chip" or "LED chips") can be used in the package 50 and fabrication of conventional LED chips is generally known, and is only briefly discussed herein. LED chips can be fabricated using known processes with a suitable process being fabrication using metal organic chemical vapor deposition (MOCVD). The layers of the LED chips generally comprise an active layer/region sandwiched between first and second oppositely doped epitaxial layers all of which are formed successively on a growth substrate. LED chips can be formed on a wafer and then singulated for mounting in a package. It is understood that the growth substrate can remain as part of the final singulated LED chip or the growth substrate can be fully or partially removed.

It is also understood that additional layers and elements can also be included in LEDs 56, including but not limited to buffer, nucleation, contact and current spreading layers as well as light extraction layers and elements. The active region can comprise single quantum well (SQW), multiple quantum well (MQW), double heterostructure or super lattice structures. The active region and doped layers may be fabricated from different material systems, with preferred material systems being Group-III nitride based material systems. Group-III nitrides refer to those semiconductor compounds formed between nitrogen and the elements in the Group III of the periodic table, usually aluminum (Al), gallium (Ga), and indium (In). The term also refers to ternary and quaternary compounds such as aluminum gallium nitride (AlGaN) and aluminum indium gallium nitride (AlInGaN). In a preferred embodiment, the doped layers are gallium nitride (GaN) and the active region is InGaN. In alternative embodiments the doped layers may be AlGaN, aluminum gallium arsenide (AlGaAs) or aluminum gallium indium arsenide phosphide (AlGaInAsP).

The growth substrate can be made of many materials such as sapphire, silicon carbide, aluminum nitride (AlN), gallium nitride (GaN), with a suitable substrate being a 4H polytype of silicon carbide, although other silicon carbide polytypes can also be used including 3C, 6H and 15R polytypes. Silicon carbide has certain advantages, such as a closer crystal lattice match to Group III nitrides than sapphire and results in Group III nitride films of higher quality. Silicon carbide also has a very high thermal conductivity so that the total output power of Group-III nitride devices on silicon carbide is not limited by the thermal dissipation of the substrate (as may be the case with some devices formed on sapphire). SiC substrates are available from Cree Research, Inc., of Durham, N.C. and methods for producing them are set forth in the scientific literature as well as in a U.S. Pat. Nos. Re. 34,861; 4,946,547; and 5,200,022.

LED chips can also comprise a conductive current spreading structure and wire bond pads on the top surface, both of which are made of a conductive material that can be deposited using known methods. Some materials that can be used for these elements include Au, Cu, Ni, In, Al, Ag or combinations thereof and conducting oxides and transparent conducting oxides. The current spreading structure can comprise conductive fingers arranged in a grid on LEDs 56 with the fingers spaced to enhance current spreading from the pads into the LED chip's top surface. In operation, an electrical signal is applied to the pads through a wire bond as described below, and the electrical signal spreads through the fingers of the current spreading structure and the top surface into the LED chips. Current spreading structures are often used in LED chips where the top surface is p-type, but can also be used for n-type materials.

Some or all of the LED chips described herein can be coated with one or more phosphors with the phosphors absorbing at least some of the LED chip light and emitting a different wavelength of light such that the LED chip emits a combination of light from the LED chip and the phosphor. In one embodiment according to the present invention the white emitting LED chips have an LED chip that emits light in the blue wavelength spectrum and the phosphor absorbs some of the blue light and re-emits yellow. The LED chips emit a white light combination of blue and yellow light. In other embodiments, the LED chips emit a non-white light combination of blue and yellow light as described in U.S. Pat. No. 7,213,940. In some embodiments the phosphor comprises commercially available YAG:Ce, although a full range of broad yellow spectral emission is possible using conversion particles made of phosphors based on the $(Gd,Y)_3(Al,Ga)_5O_{12}$:Ce system, such as the $Y_3Al_5O_{12}$:Ce (YAG). Other yellow phosphors that can be used for white emitting LED chips include: $Tb_{3-x}RE_xO_{12}$:Ce(TAG); RE=Y, Gd, La, Lu; or $Sr_{2-x-y}Ba_xCa_ySiO_4$:Eu.

The different LED chips can also comprise red, green and blue emitting LEDs can be made of structures and materials that permit emission of the desired light directly from the active region. For example, red light can emit directly from the active region in LEDs made of certain materials such as AlInGaP. Alternatively, in other embodiments the LED chips can be coated with the desired conversion material (e.g. phosphor) that provides the desired emission. For example, red emitting LED chips can comprise LED chips covered by a phosphor that absorbs the LED chip light and emits a red light. The LED chips can emit blue or UV light and some phosphors appropriate for these structures can comprise: $Lu_2O_3$:$Eu^{3+}$; $(Sr_{2-x}La_x)(Ce_{1-x}Eu_x)$ $O_4$; $Sr_{2-x}Eu_xCeO_4$; $SrTiO_3$:$Pr^{3+}$,$Ga^{3+}$; $CaAlSiN_3$:$Eu^{2+}$; and $Sr_2Si_5N_8$:$Eu^{2+}$.

The red, green and blue LED chips can be used in separate LED packages and used in LED display pixel as described above. Alternatively, the LED chips can be in packages having multiple of the red, green and blue LED chips. Some of these LED package embodiments can have all of the red, green and blue LED chips, each of which has its own intensity control to allow the package to emit many different color combinations of red, green and blue light.

Phosphor coated LED chips be coated using many different methods, with one suitable method being described in U.S. patent applications Ser. Nos. 11/656,759 and 11/899,790, both entitled "Wafer Level Phosphor Coating Method and Devices Fabricated Utilizing Method", and both of which are incorporated herein by reference.

Alternatively the LEDs can be coated using other methods such as electrophoretic deposition (EPD), with a suitable EPD method described in U.S. patent application Ser. No. 11/473,089 entitled "Close Loop Electrophoretic Deposition of Semiconductor Devices", which is also incorporated herein by reference. It is understood that LED packages according to the present invention can also have multiple LEDs of different colors, one or more of which may be white emitting.

In the embodiment shown, the reflective cup 54 is oval shaped. That is, when viewing the reflective cup 54 from above, it has a first or longitudinal axis 60 longer than the second axis 62 (i.e. its vertical axis). As discussed below, the reflective cups according to the present invention can have many different sizes and dimensions. In the embodiment shown, the LED chip 56 is rectangular shaped, and is not mounted in alignment with the first (longitudinal) axis 60 of the reflective cup 54, but is instead mounted in alignment with the second axis 62 of the reflective cup. In this arrangement, the longer sides 64 of the LED 56 are aligned with the shorter sides 66 of the reflective cup 54, and the shorter LED sides 68 are aligned with the longer sides 70 of the reflective cup 54.

This alignment can provide certain desirable LED package emission characteristics as discussed above and can relax the matching requirements of the LED package components as discussed above. That LED packages according to the present invention can be more tolerant to manufacturing variations that would, by comparison, result in a much greater negative impact on the FFP of conventional LED packages. Such manufacturing variations can include shape of the reflective cup and LED chip, placement of the LED chip in the reflective cup or placement of the wire bonds, and variation in the encapsulant.

Rotating the LED chip 56 in the reflective cup 54 as shown can also provide improved far field pattern emission characteristics compared to LED packages with horizontal oriented LED chips. FIGS. 5 and 6 show examples of the emission intensity characteristics for an LED package without lenses and having a conventionally oriented LED chip as shown in FIG. 2 above. FIG. 5 shows the horizontal far field pattern (FFP) 80 having a 50% emission intensity 82 at approximately 70 degrees horizontal radiation angle. FIG. 6 shows the vertical FFP 84 having a 50% emission intensity 86 at approximately 58 degrees vertical radiation pattern. By comparison, FIGS. 7 and 8 show examples of emission intensity characteristics for an LED package having a vertical oriented LED chip as shown in FIG. 4, and in the same reflective cup as the LED package providing the emission characteristics shown in FIGS. 5 and 6. FIG. 7 shows the horizontal FFP 88 having a 50% emission intensity 90 at approximately 76 degrees horizontal radiation angle. FIG. 8 shows the vertical FFP 92 having a 50% emission intensity 94 at approximately 65 degrees vertical emission intensity.

As illustrated by comparison of FIGS. 5 and 6 to FIGS. 7 and 8, the package with the vertical oriented LED chip has a wider viewing angle and 50% intensity in both horizontal and vertical radiation angles. The emission pattern also comprises fewer non-uniformities and has a smoother drop-off in radiation intensity through different emission angles. The differences can be attributed to different factors such as the longer emission surface of the LED chip emitting a greater integrated intensity in the horizontal direction. The increase in the vertical emission intensity can also be attributed to a number of factors, such as the edge of the LED chip being closer to the reflective surface in the vertical direction. It is noted that there can be other differences between the FFP emission for the rotated or vertical LED chip arrangement. One potential difference is that the peak emission intensity for the vertical chip LED packages can be narrower, but the radiation intensity drops off at less of an angle (more slowly at greater angles).

Figure 10:
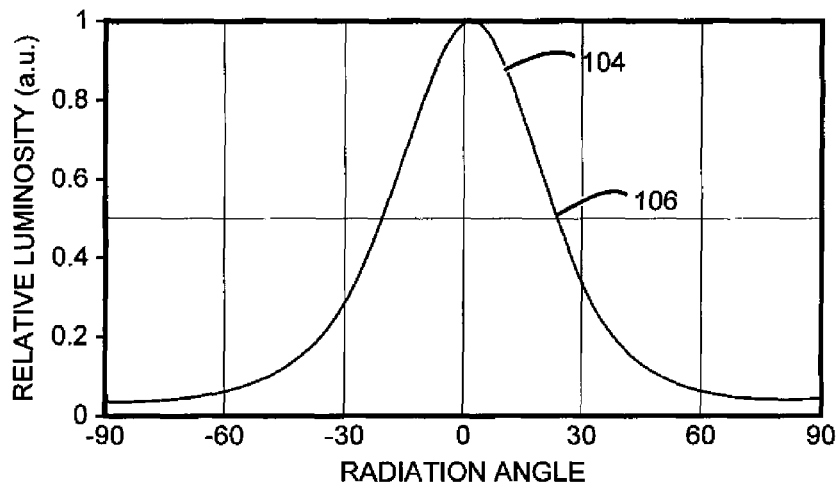
FIG. 10 is a graph showing the vertical FFP for a conventional LED package.

FIGS. 9 and 10 show examples of the emission intensity characteristics for a conventional LED package following tin soldering and encapsulation having a conventionally oriented LED chip as shown in FIG. 2 above. FIG. 9 shows the horizontal FFP 100 having a 50% emission intensity 102 at approximately 94 degrees horizontal radiation angle. FIG. 10 shows a vertical FFP 104 having a 50% emission intensity 106 at approximately 44 degrees vertical radiation pattern. These FFPs can be similar LEDs emitting different colors of light, with the FFPs 100 and 104 being for an LED package with a green emitting LED chip. For LED packages with a blue emitting LED chip in a similar reflective cup arrangement, the FFPs and 50% radiation emission intensities would be nearly the same at approximately 95 degrees horizontal and 43 degrees vertical.

Figure 11:
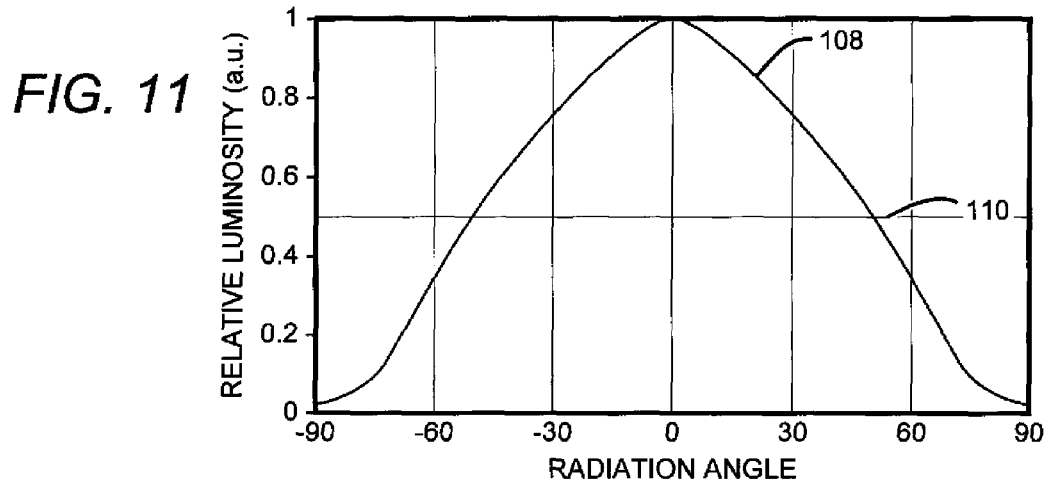
FIG. 11 is a graph showing the horizontal FFP for one embodiment of an LED package according to the present invention.
Figure 12:
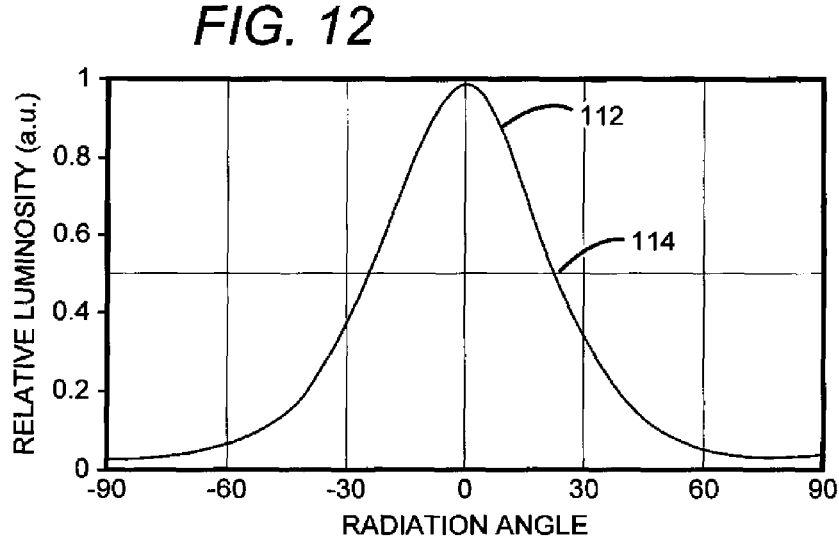
FIG. 12 is a graph showing the vertical FFP for one embodiment of an LED package according to the present invention.

By comparison, FIGS. 11 and 12 show examples of emission intensity characteristics for an LED package according to the present invention having a vertical oriented LED chip as shown in FIG. 4. The LED chip is arranged in the same or similar reflective cup as the LED package providing the emission characteristics shown in FIGS. 9 and 10. FIG. 11 shows the horizontal FFP 108 having a 50% emission intensity 110 at approximately 101 degrees horizontal radiation angle. FIG. 12 shows the vertical FFP 112 having a 50% emission intensity 114 at approximately 48 degrees vertical emission intensity. The emission pattern shown is for LED packages with green emitting LED chips. The emission patterns would be similar for LED packages having LED chips emitting other colors of light. For LED packages with blue emitting LED chip the FFP and 50% radiation emission intensities would be nearly the same at approximately 102 degrees horizontal and 48 degrees vertical.

By arranging different LED chips in different reflective cups, wider 50% viewing angle emission patterns can be achieved. In some embodiments of LED packages with red, green and blue emitting LED chips, the 50% horizontal emission intensity angle can be up to 120 degrees, while the 50% vertical emission intensity angle can be up to 70 degrees. In one embodiment of packages with green and blue LED chips, the 50% horizontal intensity angle is 115 degrees, and the 50% vertical angle is 65 degrees. In one embodiment of a package with a red LED chip the 50% horizontal intensity angle can be 108 degrees, and the 50% vertical intensity angle can 58 degrees. In different embodiment shown above, the increase in emission intensity angles can increase in the range of 0 to 5% compared to that of conventional LED packages having horizontal oriented LED chips. In other embodiments the increase can be in the range of 0 to 10%, while in other embodiments the increase can be in the range of 0 to 15%.

Figure 13:
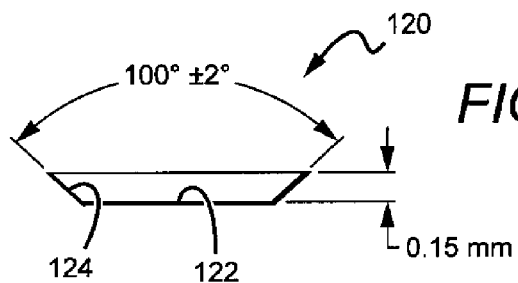
FIG. 13 is a side view of a reflector cup that can be used in LED packages according to the present invention.
Figure 14:
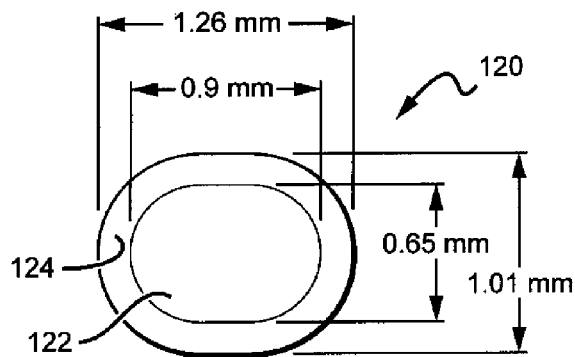
FIG. 14 is a top view of the reflector cup shown in FIG. 13.
Figure 15:
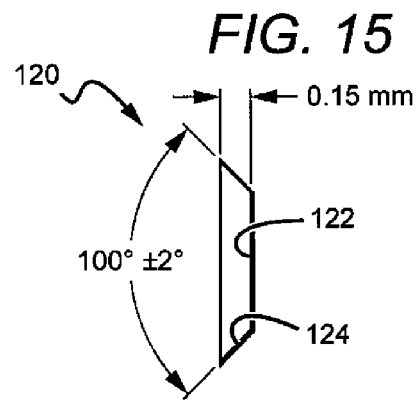
FIG. 15 is side view of the reflector cup shown in FIG. 13.
Figure 16:
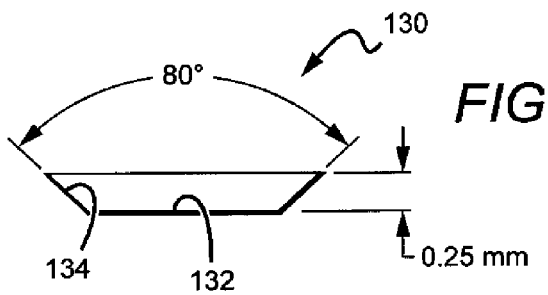
FIG. 16 is a side view of another reflector cup that can be used in LED packages according to the present invention.
Figure 17:
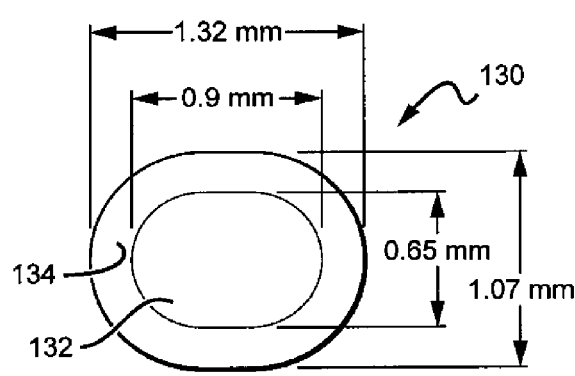
FIG. 17 is a top view of the reflector cup shown in FIG. 16.
Figure 18:
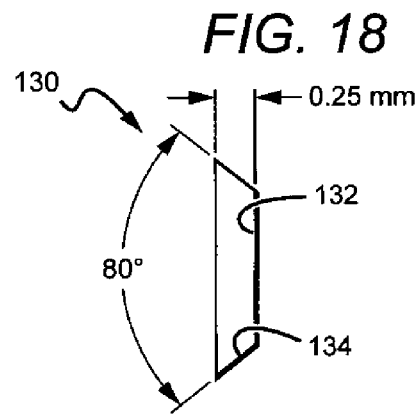
FIG. 18 is side view of the reflector cup shown in FIG. 16.

The present invention can be applicable to packages and LED chips having many different shapes and sizes. FIGS. 13 through 15 show one embodiment of an oval shaped reflective cup 120 that can be used in LED packages according to the present invention. Reflective cup 120 has a length and width of approximately 1.26 mm by 1.01 mm. The reflective cup 120 has a base 122 with a length of approximately 0.9 mm long and 0.65 mm wide, and an angled reflective surface 124 approximately 0.15 mm high with an approximate 100 degree opening. FIGS. 16 through 18 show another embodiment of a reflective cup 130 having a shape similar to reflective cup 120. Reflective cup 130 has a base 132 that is the same size of base 122 in reflective cup 120. The angled surface 134, however, has a height of approximately 0.25 mm and an approximate 80 degree opening. This results in a package the is 1.32 mm long and 1.07 mm wide. These are only two examples of the many different shapes and sizes of reflective cups that can be used in LED packages according to the present invention.

The LED packages can have LED chips with different shapes and sizes, with the rectangular shaped LED chips having a length greater that their width. In some embodiments, the length can be up to 1000 μm and the width can be up to 500 μm. In still other embodiments the length can be up to 500 μm and the width can be up to 300 μm. In one embodiment, the LED chip can have a length of approximately 480 μm and a width of approximately 260 μm.

The LED packages according to the present invention can be used to form LED displays with the LED displays having an improved far field pattern. The cumulative effect of multiple LEDs according to the present invention, with improved emission characteristics, along with the repeatable manufacturability of the LED packages, results in LED displays exhibiting the same improved emission.

LED displays can be provided according to the present invention with many different numbers of LED modules or pixels. In some embodiments the LED displays can have between 1 and 100,000 modules or pixels. In other embodiments the LED displays can have between 100,000 and 200,000 modules or pixels, while in other embodiments the LED displays can have between 200,000 and 300,000 modules or pixels. In still other embodiments, the LED displays can have more than 300,000 pixels or modules. The pixel or modules are arranged in a rectangular grid. For example, a grid can be 640 modules/pixels wide and 480 modules/pixels high, with the end size of the screen being dependent upon the actual size of the modules/pixels. The displays according to the present invention can be many different shapes and sizes with many of these displays being as large as 60 feet tall and 60 feet wide.

FIG. 19 shows emission intensity curve 140 for the horizontal FFP for one embodiment of an LED display utilizing LED packages according to the present invention. The screen exhibits substantially flat emission intensity characteristics through a range of up to 120 degrees of horizontal viewing angles. This provides improved viewing of the LED display at a greater range of angles, with the LED image having substantially the same intensity at the normal 0° viewing degree as at any viewing angle up to 60° on either side of normal. Accordingly, the image retains its quality at a larger range of angles compared to conventional LED based displays.

FIG. 20 shows a screen curve 150 for the vertical far field pattern for one embodiment of an LED display utilizing LED packages according to the present invention. The vertical pattern follows more of a Lambertian pattern than the LED packages described above and used in the display not having increased vertical emission angles. It is understood that in other embodiments, some or all of the LED packages can be arranged to have higher vertical viewing angles, with the vertical screen curve exhibiting a flat portion similar to that shown in FIG. 19.

The LED displays according to the present invention utilizing the LED packages according to the present invention can also exhibit improved emission intensity curve matching within a range of vertical viewing angles. To provide for more consistent image quality at these different viewing angles, the LED display according to the present invention provides for matching screen curves and far field patterns for the red, green and blue LEDs at these angles. Although the intensity of the light may be lower as the viewing angles increase, color quality of the picture is maintained by the emitters having the same emission curves.

The displays according to the present invention can also comprise different combinations of LED packages. That is, the LED packages in the different displays do not need to all have the same features to increase emission angles. The LED packages according to the present invention can also be used in many different lighting applications beyond LED displays, and in particular those using a small sized high output light sources requiring increased emission angles. Some of these include, but are not limited to, street lights, architectural lights, home and office lighting, display lighting and backlighting.

Beyond the increase in emission angles mentioned above, the present invention can also be utilized to compensate for certain undesirable emission characteristics. FFP non-uniformities or asymmetries can be caused by features of the LED package, such as the bond pad asymmetry, bond wire size and location, current spreading finger geometry, etc. An LED chip can also emit an asymmetric FFP. These FFP non-uniformities and asymmetries can be minimal and may be acceptable to the end user. In instances where these are not acceptable, rotation of the LED chip in a reflective cup can also allow for the control to place the imperfection in a most acceptable location in the FFP. End users many want the imperfections in the far-field to be placed in a certain position in the module or fixture to make them more or less apparent. In conventional LED packages, in order to achieve proper location of the far-field asymmetries the packages can comprise special optics, special solder boards, or attaching the package in a rotated orientation. The LED packages according to the present invention can also achieve this selective location of the far field asymmetries by rotating the LED chip in the reflective cup or package.

As mentioned above, the rectangular LED chip can also be rotated in reflective cups having different shapes other than oval shaped. The LED chips can take many different shapes beyond rectangular, and these differently shaped LEDs can be mounted in reflective cups having many different shapes. In all of these, rotation would result in the FFP asymmetries being in different locations.

FIG. 21 shows another embodiment of an LED package 200 according to the present invention that is a two pin type package similar to the embodiment shown in FIG. 4. It comprises an LED chip 202 mounted to the base of a reflective cup 204, with wire bonds 206a, 206b connected between the package pins and the LED chip for applying an electrical signal to the LED chip. In this embodiment, however, the LED chip 202 is square and the reflective cup 204 is circular. The reflective cup 204 comprising a first axis 210 that is generally aligned with package pins, and a second axis 212 that is orthogonal to the first axis 210. The LED chip 202 is mounted in the reflective cup 204 off alignment with the first and second axis 210, 212. That is, its lateral edges of the LED chip 202 are not aligned with the first or second axis 210, 212. Instead, the LED chip 202 is at an angle or rotated in relation to both the axis 210, 212. By angling or rotating the LED chip 202 in the reflective cup 204, the FFP asymmetries can be at a different location in the FFP compared to an package with the LED chip aligned with the axis.

It is understood that the LED chip 202 can be rotated at many different angles within the range of 0 to 90 degrees. In the embodiment shown, the LED chip 202 is rotated at an angle of approximately 45 degrees to the axis 210, 212.

FIGS. 22 and 23 show another embodiment of a surface mount LED package 220 according to the present invention comprising a substrate 222, a reflective cup 224 mounted to the substrate 222, and a square LED chip 226 (shown in FIG. 23) mounted to the substrate 222 within the reflective cup 224. As discussed above, the LED chip 226 can be many different shapes other than square. The LED package 220 further comprises a lens 227 over the reflective cup 224. The LED package 220 is arranged similar to LED packages available from Cree, Inc., in Durham, N.C. under the XLamp® XR-E and XLamp® XR-C model designators. The LED package 220 has a first axis 231 running between the package contacts 232a, 232b and a second axis 234 that is orthogonal to the first axis 231. Unlike the similar commercially available LED packages, the LED chip 226 is angled or rotated in the reflective cup so that its edges are not aligned with the first or second axis 231, 234. This can be done to change the location of the FFP asymmetries as discussed above. Like the LED package 200, the LED chip 226 can be arranged at many different angles to the axis 231, 234 in the range of 0 to 90 degrees. In the embodiment shown, the LED chip can be arranged with its edges at an 45 degree angle to the axis 231, 234.

Figure 25:
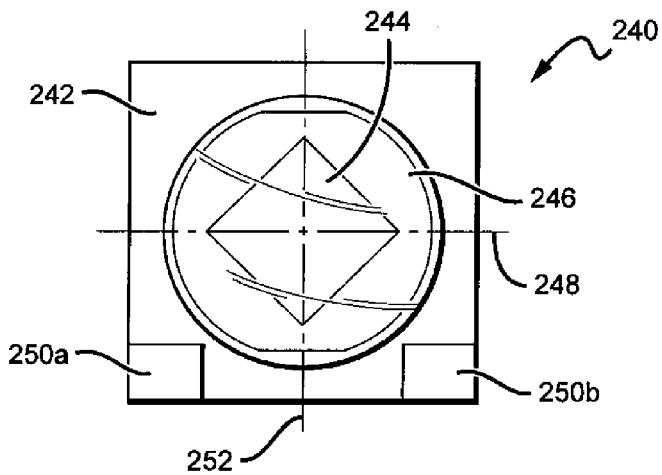
FIG. 25 is top view of the LED package in FIG. 24.

FIGS. 24 and 25 show another embodiment of an LED package 240 according to the present invention comprising a substrate 242 with an LED chip 244 mounted to the substrate 242. A lens 246 can be molded on the substrate 242 in a hemispheric shape over the LED chip 244. The LED package 240 is arranged similar to LED packages available from Cree, Inc., in Durham, N.C. under the XLamp® XP-E and XLamp® XP-G model designators. The LED package 240 comprises a first axis 248 running between the package contacts 250a, 250b, and a second axis 252 orthogonal to the first axis 248. Like the packages above, the LED chip is angled or rotated with its edges out of alignment with the first and second axis 248, 252. The range or rotation can be 0 to 90 degrees, with the embodiment shown having an LED chip rotated approximately 45 degrees.

The LED package embodiments discussed above have a single LED chip mounted in reflective cup or mounted to a substrate. It is understood that other LED package embodiments can have more than one LED chip mounted within a reflective cup or on a substrate. All or some of the multiple LED chips in these embodiments can be rotated, and in other embodiment each of the LED chips can have the same angle of rotation or some can have different angles of rotation. The particular angle for each LED chip can be dictated by a number of factors, with one being the particular FFP asymmetries for the particular chip and the desired location for the FFP patter asymmetry.

Figure 26:
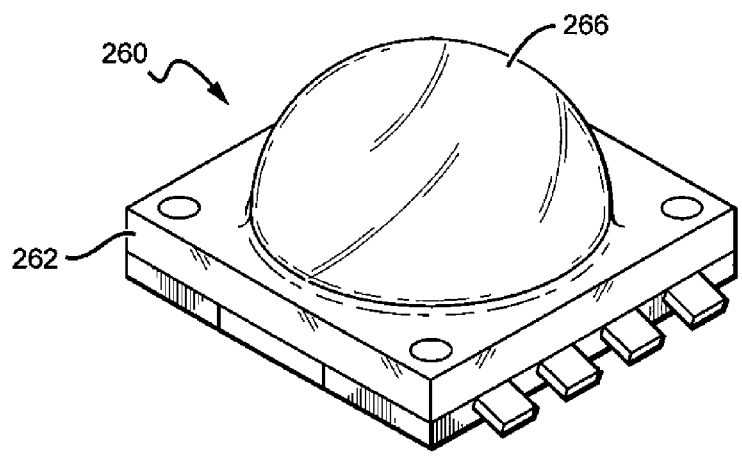
FIG. 26 is a perspective view of still another embodiment of a LED package according to the present invention.
Figure 27:
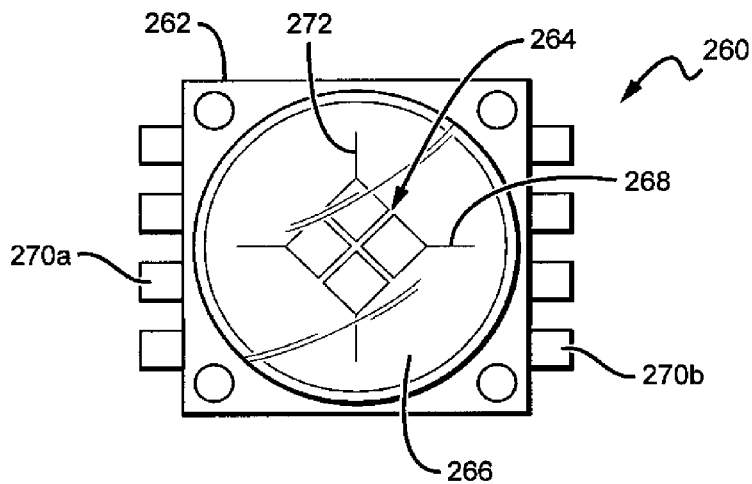
FIG. 27 is a top view of the LED package in FIG. 26.

FIGS. 26 and 27 show one embodiment of a multiple chip LED package 260 according to the present invention comprising a substrate 262 and a 4-chip LED array 264 (shown in FIG. 27) mounted to the substrate 262. A lens 266 is formed on the substrate 262 over the LED array 264. The LED package 260 is arranged similar to LED packages available from Cree, Inc., in Durham, N.C. under the XLamp® MC-E model designator. The LED package 260 comprises a first axis 268 running between the first contacts 270a on one side of the substrate 262 and the second contacts 270b on the opposite side. The package 260 also comprises a second axis 272 orthogonal to the first axis 268. In this embodiment, the LED array 264 comprises square LED chips arranged in a square array, but it is understood that the LED chips can have many different shapes and the array can also have many different shapes. The LED array 264 is angled or rotated on the substrate 262 so that the edges of the array is not aligned with either axis 268, 270. Like the rotated LED chips above, the LED array 264 can be rotated at any angle to the axis in the range of 0-90 degrees, with the array shown having an angle of approximately 45 degrees to the axis.

Although the present invention has been described in detail with reference to certain preferred configurations thereof, other versions are possible. Therefore, the spirit and scope of the invention should not be limited to the versions described above.

We claim:

1. A light emitting diode (LED) package, comprising:
    a reflective cup and an LED chip mounted in said reflective cup, wherein said reflective cup has a first axis and a second axis orthogonal to said first axis, wherein said LED chip is rotated within said reflective cup so that said LED chip is out of alignment with said first axis; and
    a substrate with said LED chip and said reflective cup mounted on said substrate;
    wherein said LED chip has a chip long axis, said chip long axis normal to said first axis.

2. The LED package of claim 1, wherein said LED chip is out of alignment with said second axis.

3. The LED package of claim 1, wherein said LED chip has edges, wherein said edges are out of alignment with said first and second axis.

4. The LED package of claim 1, wherein said LED chip is aligned with said second axis.

5. The LED package of claim 1, wherein said reflective cup is oval shaped.

6. The LED package of claim 5, wherein said LED chip is rectangular shaped.

7. The LED package of claim 5, wherein said first axis is said oval shaped reflector cup's longitudinal axis, said LED chip aligned with said second axis.

8. The LED package of claim 1, wherein said reflective cup is circular.

9. The LED package of claim 1, wherein said LED chip is out of alignment with said first axis at an angle between 0 and 90 degrees.

10. The LED package of claim 1, wherein said LED chip is out of alignment with said first axis at an angle of approximately 45 degrees.

11. The LED package of claim 1, wherein said LED chip is part of an array of LED chips.

12. The LED package of claim 1, emitting a far-field pattern having a 50% emission intensity angle that is wider than the same LED package wherein said LED chip is aligned with said first axis.

13. The LED package of claim 1, further comprising a lens over said LED chip.

14. An light emitting diode (LED) package, comprising:
    a substrate and an LED chip mounted on said substrate, wherein said substrate has a first longitudinal axis, and wherein said LED chip is mounted on said substrate so that said LED chip is out of alignment with said first axis,
    further comprising a reflective cup on said substrate,
    wherein said LED package emits a far-field pattern having a 50% emission intensity angle that is wider than when said LED chip is aligned with said first axis.

15. The LED package of claim 14, further comprising a lens over said LED chip.

16. The LED package of claim 15, wherein said first axis runs between the contacts on said substrate.

17. The LED package of claim 14, further comprising a second axis that is orthogonal to said first axis wherein said LED chip is out of alignment with said second axis.

18. The LED package of claim 17, wherein said LED chip is aligned with said second axis.

19. The LED package of claim 17, wherein said LED chip is out of alignment with said first axis at an angle between 0 and 90 degrees.

20. The LED package of claim 17, wherein said LED chip is out of alignment with said first axis at an angle of approximately 45 degrees.

21. The LED package of claim 17, wherein said LED chip is part of an array of LED chips.

22. An light emitting diode (LED) package, comprising:
    a rectangular LED chip having a chip longitudinal axis;
    an oval shaped reflective cup having a cup longitudinal axis, said LED chip mounted within said reflective cup with said chip longitudinal axis normal to said cup longitudinal axis; and
    a substrate with said LED chip and said reflective cup mounted on said substrate.

23. The LED package of claim 22, wherein said chip longitudinal axis is orthogonal to said cup longitudinal axis.

24. The LED package of claim 22, wherein said LED chip is part of an array of LED chips.

25. The LED package of claim 22, emitting a far-field pattern having a 50% emission intensity angle that is wider than the same LED package wherein said chip longitudinal axis is aligned with said cup longitudinal axis.

26. The LED package of claim 22, further comprising a lens over said LED chip.

27. A light emitting diode (LED) display, comprising:
    a plurality of LED packages, at least some of which have an LED chip mounted in a reflective cup, said package having a first axis that is orthogonal to a second axis, said LED chip mounted out of alignment with said first axis; and
    a substrate with said LED chip and said reflective cup mounted on said substrate;

wherein each LED package emits a far-field pattern having a 50% emission intensity angle that is wider than when said LED chip is aligned with said first axis.

28. The display of claim 27, wherein said LED chip is out of alignment with said second axis.

29. The display of claim 27, wherein said LED chip has edges, wherein said edges are out of alignment with said first and second axis.

30. The display of claim 27, wherein said LED chip is aligned with said second axis.

31. The display of claim 27, wherein each said reflective cup is oval shaped.

32. The display of claim 31, wherein each said LED chip is rectangular shaped.

33. The display of claim 31, wherein said first axis is said oval shaped reflector cup's longitudinal axis, said LED chip aligned with said second axis.

34. The display of claim 27, wherein said reflective cup is circular.

35. The display of claim 27, wherein each said LED chip is out of alignment with said first axis at an angle between 0 and 90 degrees.

36. The display of claim 27, wherein each said LED chip is out of alignment with said first axis at an angle of approximately 45 degrees.

37. The display of claim 27, wherein each said each said LED chip is part of an array of LED chips.

38. An emitter, comprising;
an LED chip mounted within a package, wherein said LED chip has a chip tong axis and said package has a package long axis, wherein the said chip long axis is oriented differently than said package long axis;
wherein said LED chip emits a far-field pattern having a 50% emission intensity angle that is wider than when said chip long axis is aligned with said package long axis.

39. A light emitting diode (LED) package, comprising:
an LED chip on a submount or a reflective cup; and
a lens over said LED chip, wherein said lens has a first axis and a second axis orthogonal to said first axis, wherein said LED chip is on said submount or reflective with said LED chip out of alignment with said first axis;
wherein said LED package emits a far-field pattern having a 50% emission intensity angle that is wider than when said LED chip is aligned with said first axis.

40. The LED package of claim 39, wherein said LED chip is also out of alignment with said second axis.

* * * * *

UNITED STATES PATENT AND TRADEMARK OFFICE
CERTIFICATE OF CORRECTION

| | | |
|---|---|---|
| PATENT NO. | : 8,748,915 B2 | Page 1 of 1 |
| APPLICATION NO. | : 12/868567 | |
| DATED | : June 10, 2014 | |
| INVENTOR(S) | : Alex Chi Keung Chan et al. | |

It is certified that error appears in the above-identified patent and that said Letters Patent is hereby corrected as shown below:

In the Claims

Column 16, Line 5, after "chip has a chip" please delete "tong" and add --long--

Signed and Sealed this
Twenty-first Day of October, 2014

Michelle K. Lee
*Deputy Director of the United States Patent and Trademark Office*